US012353269B2

(12) United States Patent
Furukawa

(10) Patent No.: US 12,353,269 B2
(45) Date of Patent: Jul. 8, 2025

(54) INFORMATION PROCESSING DEVICE AND INFORMATION PROCESSING METHOD

(71) Applicant: SONY GROUP CORPORATION, Tokyo (JP)

(72) Inventor: Ryosuke Furukawa, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 405 days.

(21) Appl. No.: 17/909,904

(22) PCT Filed: Jul. 20, 2020

(86) PCT No.: PCT/JP2020/028021
§ 371 (c)(1),
(2) Date: Sep. 7, 2022

(87) PCT Pub. No.: WO2021/186756
PCT Pub. Date: Sep. 23, 2021

(65) Prior Publication Data
US 2023/0104680 A1 Apr. 6, 2023

Related U.S. Application Data

(60) Provisional application No. 62/990,758, filed on Mar. 17, 2020.

(51) Int. Cl.
*G06F 11/00* (2006.01)
*G01R 31/392* (2019.01)
*G05B 23/02* (2006.01)

(52) U.S. Cl.
CPC ........ *G06F 11/008* (2013.01); *G05B 23/0283* (2013.01)

(58) Field of Classification Search
CPC ..... G01R 31/392; G01R 19/165; G01R 31/00
See application file for complete search history.

(56) References Cited

U.S. PATENT DOCUMENTS 5,742,574 A * 4/1998 Yachida ............. G11B 20/1833
369/53.16
10,629,800 B2 * 4/2020 Gong ....................... C08J 5/245
(Continued)

FOREIGN PATENT DOCUMENTS

CN 107733963 A 2/2018
JP 2001-297954 A 10/2001
(Continued)

*Primary Examiner* — Huy Q Phan
*Assistant Examiner* — Temilade S Rhodes-Vivour
(74) *Attorney, Agent, or Firm* — Paratus Law Group, PLLC

(57) ABSTRACT

The present disclosure relates to an information processing device and an information processing method capable of reducing cost and replacing a deteriorated emergency reporting device at an appropriate timing while maintaining reliability.

A time from start of charging to full charging of a supercapacitor serving as a power source of the emergency reporting device of a vehicle is measured as state information indicating a degree of deterioration of the supercapacitor, an evaluation value is calculated on the basis of the state information, and necessity of replacement of the emergency reporting device according to the deterioration of the supercapacitor is determined from comparison between the evaluation value and a threshold value. The present disclosure can be applied to a system that uses a supercapacitor as a power source and determines necessity of replacement of an emergency reporting device mounted on a vehicle.

15 Claims, 15 Drawing Sheets

(56) References Cited

U.S. PATENT DOCUMENTS

| | | | | |
|---|---|---|---|---|
| 11,164,435 B1* | 11/2021 | Skeoch | ............... | G08B 15/001 |
| 2012/0299556 A1 | 11/2012 | Ishikawa | | |
| 2014/0297100 A1* | 10/2014 | Miura | ................. | G08B 25/016 |
| | | | | 701/31.5 |
| 2015/0166373 A1* | 6/2015 | Landon | ................. | C02F 1/4691 |
| | | | | 204/554 |
| 2016/0096437 A1* | 4/2016 | Tripathi | .................... | H02J 7/00 |
| | | | | 307/31 |
| 2020/0055472 A1 | 2/2020 | Kageyama | | |

FOREIGN PATENT DOCUMENTS

| | | | |
|---|---|---|---|
| JP | 2004322987 A | | 11/2004 |
| JP | 2005-033914 A | | 2/2005 |
| JP | 2005145278 A | | 6/2005 |
| JP | 2006-324591 A | | 11/2006 |
| JP | 2007-124883 A | | 5/2007 |
| JP | 2009-165262 A | | 7/2009 |
| JP | 2020028021 A | | 2/2020 |
| WO | WO 2013/030660 A1 | | 3/2013 |
| WO | WO 2013/125170 A1 | | 8/2013 |
| WO | WO 2018/139213 A1 | | 8/2018 |
| WO | WO 2019/069732 A1 | | 4/2019 |

\* cited by examiner

INFORMATION PROCESSING DEVICE AND INFORMATION PROCESSING METHOD

CROSS REFERENCE TO PRIOR APPLICATION

This application is a National Stage Patent Application of PCT International Patent Application No. PCT/JP2020/028021 (filed on Jul. 20, 2020) under 35 U.S.C. § 371, which claims benefit of U.S. Provisional Application No. 62/990,758 (filed on Mar. 17, 2020), which are all hereby incorporated by reference in their entirety.

TECHNICAL FIELD

The present disclosure relates to an information processing device and an information processing method, and more particularly, to an information processing device and an information processing method capable of reducing cost and replacing a deteriorated emergency reporting device at an appropriate timing while maintaining reliability.

BACKGROUND ART

Telematics automobile insurance that recognizes a driving state using a smartphone possessed by a driver and reflects the driving state in insurance premiums is becoming widespread.

The telematics automobile insurance is automobile insurance that evaluates driving on the basis of a driving state of a driver acquired using a smartphone possessed by the driver who is an insurance contractor, and provides a discount and the like of insurance premiums based on the evaluation result.

In the telematics automobile insurance, there has been proposed a technique for promoting safe driving by evaluating driving on the basis of a driving state of a driver acquired using a smartphone possessed by the driver who is an insurance contractor, notifying the driver's smartphone of the driving evaluation, and displaying the driving evaluation (see Patent Document 1).

Furthermore, in the telematics automobile insurance, since it is assumed that a driver who is an insurance contractor possesses a smartphone, there is a service in which an emergency reporting device including a button and the like to be operated when an emergency situation occurs in a vehicle is installed in the vehicle, and notification of the occurrence of the emergency situation is performed from the emergency reporting device via the smartphone as an additional service of the automobile insurance.

CITATION LIST

Patent Document

Patent Document 1: WO 2019/069732 A

SUMMARY OF THE INVENTION

Problems to be Solved by the Invention

Meanwhile, the emergency reporting device normally has a configuration that is driven by an external power source supplied from an accessory of the vehicle and the like, but in a situation where an emergency situation occurs, it is conceivable that the emergency reporting device may fall into a state in which power source supply from the vehicle becomes impossible.

In particular, it is desirable that the emergency reporting device can operate more stably in a situation in which the urgency is high in a manner that the power supply from the vehicle becomes impossible.

That is, the emergency reporting device needs to have a configuration capable of independently driving power source supply when power source supply from the vehicle becomes impossible.

As a power source that can be driven independently by the emergency reporting device, a disposable battery, a repeatedly chargeable battery, and the like can be considered.

In a case of a disposable battery, if the battery is discharged, the battery becomes unusable.

Furthermore, the repeatedly chargeable battery has no risk of discharging, but the types of batteries that can be used are limited from the viewpoint of safety and cost in a case where the battery is used in a vehicle in which the use environment, particularly the environment with respect to temperature, is severe.

For example, a supercapacitor is conceivable as a repeatedly chargeable battery, but when a liquid dielectric is used, the liquid evaporates when a high temperature state is repeated, and deterioration may progress. The battery can be used longer than a disposable battery, but it is necessary to replace the emergency reporting device itself including the battery before the battery deteriorates and becomes unusable.

However, since the degree of deterioration of the supercapacitor greatly varies depending on the use environment of the vehicle used by the insurance contractor, if the emergency reporting devices of all the insurance contractors are replaced in a period that is absolutely safe uniformly, the deterioration does not progress, and the sufficiently usable emergency reporting device is also replaced, which deteriorates the cost.

The present disclosure has been made in view of such a situation, and in particular, by evaluating deterioration of an emergency reporting device and individually performing notification of an appropriate replacement timing, it is possible to reduce cost and replace the deteriorated emergency reporting device at an appropriate timing while maintaining reliability.

Solutions to Problems

An information processing device and an information processing method according to one aspect of the present disclosure are an information processing device including: a state information acquisition unit that acquires state information indicating a degree of deterioration of hardware; and a reliability evaluation unit that evaluates reliability of the hardware on a basis of the state information.

An information processing method according to one aspect of the present disclosure is an information processing method including: acquiring state information indicating a degree of deterioration of hardware; and evaluating reliability of the hardware on a basis of the state information.

In one aspect of the present disclosure, state information indicating a degree of deterioration of hardware is acquired; and reliability of the hardware is evaluated on a basis of the state information.

MODE FOR CARRYING OUT THE INVENTION

Figure 1:
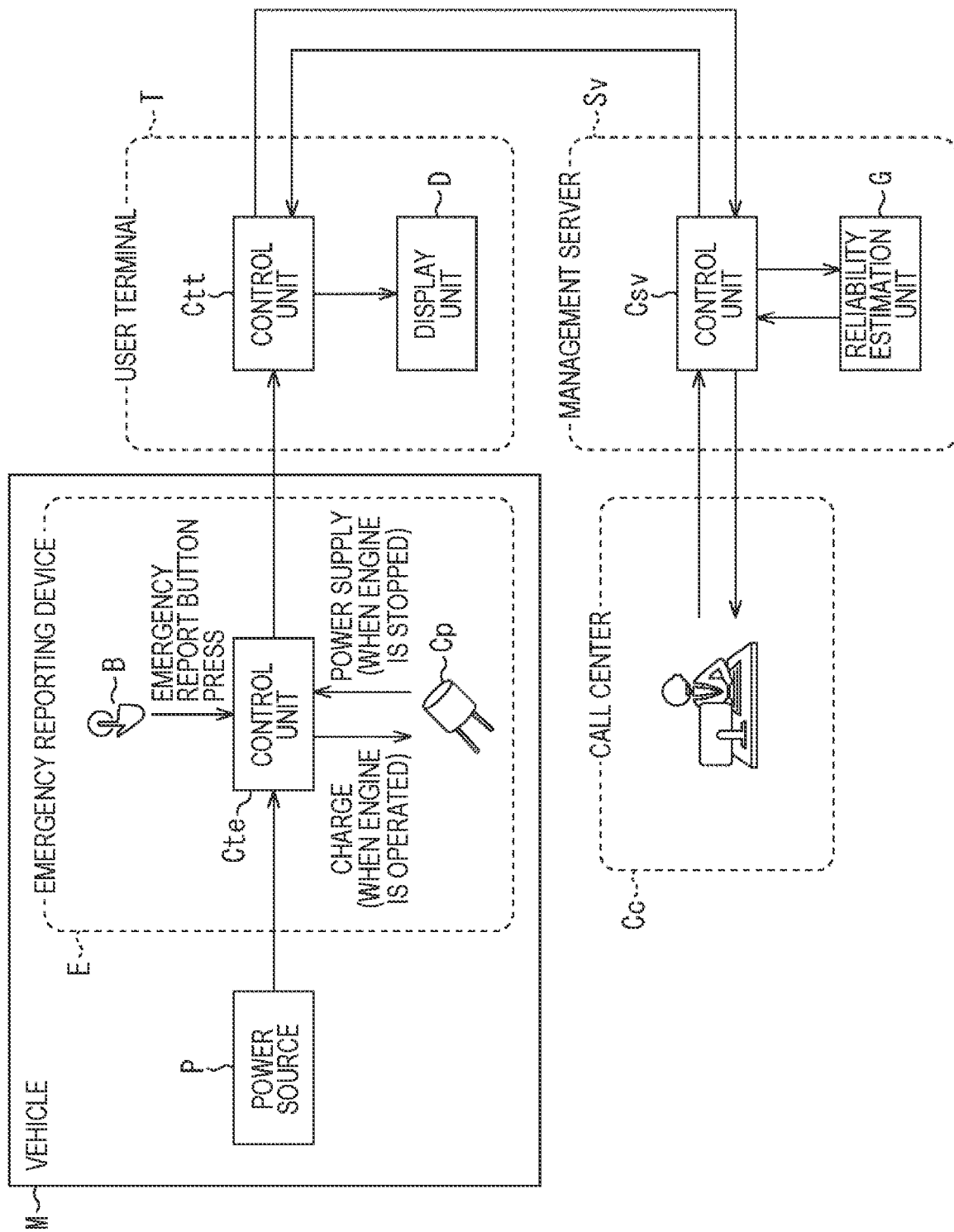
FIG. 1 is a diagram illustrating an overview of the present disclosure.

Hereinafter, preferred embodiments of the present disclosure will be described in detail with reference to the accompanying drawings. Note that, in the present specification and the drawings, components having substantially the same functional configuration are denoted by the same reference numerals, and redundant description is omitted.

Hereinafter, modes for carrying out the present technology will be described. The description will be given in the following order.

1. Overview of present disclosure
2. Preferred embodiment
3. Application example
4. Example executed by software 1. Overview of Present Disclosure The present disclosure enables evaluating deterioration of an emergency reporting device and individually performing notification of an appropriate replacement timing, making it possible to reduce cost and replace the deteriorated emergency reporting device at an appropriate timing while maintaining reliability.

In recent years, as an emergency reporting system that smoothly contact an automobile insurance company in the event of an emergency such as an accident while driving and the like, an emergency reporting device having a function of being able to immediately contact the automobile insurance company by pressing an emergency reporting button is attracting attention.

There are roughly two methods for securing power of such an emergency reporting device. One is a method of obtaining power from a USB terminal, an accessory socket, and the like provided in the vehicle. The other is a method of mounting some power source on the emergency reporting device itself.

In general, it is common to adopt a configuration in which power is supplied from a USB terminal or an accessory socket provided in a semi-permanent vehicle.

However, a state in which the emergency reporting device is used is a case where a trouble such as an accident and the like occurs, and when the emergency reporting device is placed in such a situation on a public road, the vehicle is generally stopped on a road shoulder and the engine is stopped in many cases.

As described above, in a case where the engine is stopped, the electromotive force cannot be obtained from the vehicle side, in a manner that the emergency reporting device cannot be used.

That is, when it is desired to make the emergency reporting device function the most, there is a possibility that the power source is lost and the emergency reporting device cannot be used.

Therefore, even in a state where an emergency situation occurs, it is necessary to adopt a configuration in which some power source (battery) is mounted on the emergency reporting device itself in order to secure power.

The battery is roughly divided into a primary battery on the premise of replacement and a secondary battery that can be repeatedly charged and discharged.

In a case where a battery can be used even in a state where the engine is stopped and the engine is operated, it is desirable to use the secondary battery in order to make the configuration semi-permanently usable when power can be secured from the vehicle side.

However, since there is a possibility that the emergency reporting device provided in the vehicle is left in an environment where the in-vehicle temperature reaches nearly 90 degrees in the summer season under the blazing sun and the like, it is difficult to use the secondary battery from the viewpoint of safety.

That is, in a case where a battery is used, there is substantially no configuration that can be used even in a state where the engine is stopped, has safety, and can be used for a long period of time.

Therefore, a configuration using a charge-discharge type passive element called a supercapacitor instead of a battery as a power source mounted on the emergency reporting device is considered.

By using the supercapacitor, it is possible to drive the driving emergency reporting device by power source supply from the vehicle and charge the supercapacitor when the engine is operated, and to drive the emergency reporting device by discharging the power charged in the supercapacitor when the engine is stopped.

Furthermore, since the member used for the supercapacitor is a passive element, there is no ignition risk of the secondary battery and the like in principle, and thus, it is also possible to secure safety.

However, the supercapacitor may cause a decrease in power due to volatilization in a vehicle at a high temperature because the dielectric is liquid.

Furthermore, other members in the emergency reporting device may cause some abnormality in the vehicle under high temperature.

In view of such a background, it is common to set stricter quality standards and manage to leave a margin in reliability, but this increases the quality cost and adversely affects the investment effect (ROI).

Moreover, it is easy to imagine that there is a clear difference in quality deterioration between an emergency reporting device in a vehicle managed under the blazing sun and an emergency reporting device in a vehicle managed in an underground parking lot and the like and not managed under the blazing sun.

In such a case, if only an emergency reporting device having a high failure tendency in a vehicle managed under the blazing sun is detected, and a new emergency reporting device is sent again to prompt replacement, it is possible to suppress the occurrence of an emergency reporting device to be replaced more than necessary, and to reduce the cost.

Therefore, in the present disclosure, the estimated capacitance of the supercapacitor is calculated as information indicating a deterioration state of the emergency reporting device, and is transferred to a user terminal such as a smartphone and the like possessed by the user when the user gets in the vehicle.

Furthermore, the user terminal transfers the information indicating the deterioration state of the emergency reporting device to the management server managed and operated by the automobile insurance company on the network.

Then, the management server monitors the quality deterioration of the emergency reporting device on the basis of the information indicating the deterioration state of the emergency reporting device, and urges replacement of only the emergency reporting device that has deteriorated more than the predetermined state and needs to be replaced.

With such a configuration, an emergency reporting system that can be used for a long period of time even in a state where the engine is stopped while maintaining the safety of the emergency reporting device and improves the ROI is realized.

Next, an overview of the present disclosure will be specifically described with reference to the emergency reporting system in FIG. 1.

As illustrated in FIG. 1, the emergency reporting system of the present disclosure includes a vehicle M, a user terminal T, a management server Sv, and a call center Cc.

The vehicle M is a vehicle on which a user who is an insurance contractor boards as a driver, and is mounted with an emergency reporting device E.

The emergency reporting device E has a configuration detachable from the vehicle M, and includes a control unit Cte that controls the entire operation, an emergency report button B operated in an emergency, and a charging device Cp that charges power when the engine of the vehicle M is in operation, and supplies the charged power to the control unit Cte when the engine of the vehicle M is stopped.

When the engine of the vehicle M is in operation, the control unit Cte is driven by power supplied from a power source P of the vehicle M, and supplies the power to the charging device Cp to charge the charging device Cp.

Furthermore, when the engine of the vehicle M is stopped, the control unit Cte is driven for a predetermined time corresponding to the charging time by being supplied with the power charged by the charging device Cp.

Moreover, the control unit Cte has a short-range communication function such as Bluetooth (registered trademark), and when the emergency report button B is operated, the control unit Cte notifies the user terminal T including a smartphone and the like of an emergency report indicating occurrence of an emergency situation by the short-range communication function.

Furthermore, when the engine of the vehicle M is started, the control unit Cte measures a time until the charging device Cp is fully charged as information indicating a deterioration state of the charging device Cp, controls a short-range communication function such as Bluetooth (registered trademark) and the like, and notifies the user terminal T of the time.

The charging device Cp is, for example, a supercapacitor including a dielectric made of liquid, and charges power supplied from the power source P of the vehicle M, and supplies the power to the control unit Cte for a predetermined time after the power supply from the power source P is stopped when the power supply from the power source P is stopped.

Since the charging device Cp may be used in a severe environment such as under the blazing sun and the like such as the vehicle M, when the high temperature state continues, the dielectric evaporates, the charge capacity decreases, and deterioration progresses.

Although the emergency reporting device E is provided with a plurality of configurations other than the charging device Cp, there are few emergency notification devices that are more likely to deteriorate than the charging device Cp, and in general, the degree of deterioration of the charging device Cp may be regarded as substantially deterioration of the emergency reporting device E.

Therefore, in the charging device Cp, the time from the start of charging to full charge, that is, the capacitance of the charging device Cp is information indicating the degree of deterioration of the emergency reporting device E. Therefore, the control unit Cte measures, for example, the time from the start of the engine until the charging device Cp is fully charged as information indicating deterioration of the emergency reporting device E, and notifies the user terminal T of the time as state information.

Note that, since the charging device Cp is discharged by driving the control unit Cte for a predetermined time every time after the engine is turned off, when a predetermined time elapses after the engine is stopped and the engine is restarted, the charging device Cp is in a completely discharging state.

Therefore, the time from the start of the engine to the full charge is the time from the fully discharged state to the full charge according to the capacitance that can be charged in the charging device Cp, and thus can be used as a guide indicating the deterioration state of the charging device Cp.

The user terminal T is, for example, a mobile terminal such as a smartphone possessed by a user as an insurance contractor.

The user terminal T includes a control unit Ctt that controls the entire operation of the user terminal T, an organic electro luminescence (EL), a liquid crystal display (LCD), and the like, and includes a display unit D that displays various types of information.

An application program for realizing the emergency reporting system is installed in the user terminal T, and the control unit Ctt functions by executing the installed application program.

When the emergency report indicating the occurrence of the emergency situation is transmitted from the emergency reporting device E of the vehicle M by the short-range communication function, the control unit Ctt notifies the management server Sv managed and operated by the automobile insurance company of the reception of the emergency call through Wi-Fi or a public network.

Since the user terminal T includes a device (not illustrated) having a position information detection function such as GPS and the like, the control unit Ctt notifies the management server Sv of the emergency report with the position information of the current position of the vehicle M.

Furthermore, in response to the notification indicating the reception of the emergency report including the position information of the vehicle M, the control unit Ctt receives the map information indicating the position information of the staff member supporting the emergency situation of the user vehicle M supplied from the management server Sv and the position information of the vehicle M, and causes the display unit D to display the map information.

Therefore, the user who is an insurance contractor driving the vehicle M can visually recognize the image including the map information indicating the position information of the staff member supporting the emergency situation of the vehicle M of the user and the position information of the vehicle M displayed on the display unit D of the user terminal T, and can grasp when the staff member will arrive.

Moreover, when the user terminal T acquires state information including the time from the start of the engine of the charging device Cp to the full charge as information indicating the degree of deterioration of the emergency reporting device E, the user terminal T notifies the management server Sv of the state information.

Then, when information indicating that the emergency reporting device E needs to be replaced is transmitted from the management server Sv on the basis of the state information indicating deterioration of the emergency reporting device E, the information is displayed on the display unit D.

Therefore, the user can recognize that the deterioration of the emergency reporting device E, in particular, the deterioration of the electrostatic capacitance of the charging device Cp has progressed, and it is a timing when replacement is necessary.

The management server Sv includes a control unit Csv that controls the entire operation of the management server Sv, and a reliability estimation unit G that estimates the reliability of the emergency reporting device E on the basis of state information indicating the degree of deterioration of the emergency reporting device E.

The control unit Csv branches the information sent from the user terminal T into an emergency report indicating that an emergency situation has occurred and state information indicating the degree of deterioration of the emergency reporting device E, and notifies the call center CC of the emergency report.

The call center CC is, for example, a server including an information processing device and the like operated by a staff member supporting an emergency situation, and gives instruction to dispatch a staff member for supporting the user to the site on the basis of the position information of the vehicle M when notification of the occurrence of the emergency situation and the position information of the vehicle M is performed.

Moreover, the call center CC acquires the position information of the staff member detected by the terminal possessed by the staff member to be dispatched to the site, generates the governor information including both the position information together with the position information of the vehicle M, and notifies the user terminal T via the management server Sv.

Furthermore, the control unit Csv of the management server Sv outputs state information indicating the degree of deterioration of the emergency reporting device E to the reliability estimation unit G.

The reliability estimation unit G performs evaluation on the basis of the time from the start of the engine of the charging device Cp to the full charge, which is state information indicating the degree of deterioration of the emergency reporting device E, estimates whether or not the emergency reporting device E can be used in a state where the reliability is maintained, that is, whether or not replacement is necessary on the basis of whether or not the evaluation continues for a predetermined period or longer after the evaluation becomes lower than a predetermined threshold value, and outputs the estimation result to the control unit Csv as a reliability estimation result.

The control unit Csv notifies the call center CC of the reliability estimation result.

In this case, the call center CC determines whether or not replacement of the emergency reporting device E is necessary on the basis of the reliability estimation result, and in a case where replacement is necessary, the charging device Cp arranges the emergency reporting device E for replacement, that is, a new emergency reporting device E, and causes the emergency reporting device E to be delivered, for example, by home delivery and the like to the user who is an insurance contractor of the target vehicle M.

Furthermore, the call center CC generates information indicating that the emergency reporting device E needs to be replaced as an image, for example, and transmits the image to the user terminal T possessed by the user who is an insurance economizer of the target vehicle M via the management server Sv.

Through the series of processings described above, it is possible to grasp the deterioration state of the charging device Cp, which indicates the deterioration of the emergency reporting device E, and selectively replace only those that need to be replaced.

As a result, it is possible to replace only the emergency reporting device E that needs to be replaced according to the degree of deterioration of the emergency reporting device E for each vehicle M having different use environments. Therefore, it is possible to improve the ROI by realizing an emergency reporting system that can be used for a long period of time even in a state where the engine is stopped while maintaining the safety and reliability of the emergency reporting device E, and further realizing cost reduction.

2. Preferred Embodiment

Configuration Example of Emergency Reporting System

Next, a configuration example of an emergency reporting system to which the technology of the present disclosure is applied will be described with reference to FIG. 2.

Figure 2:
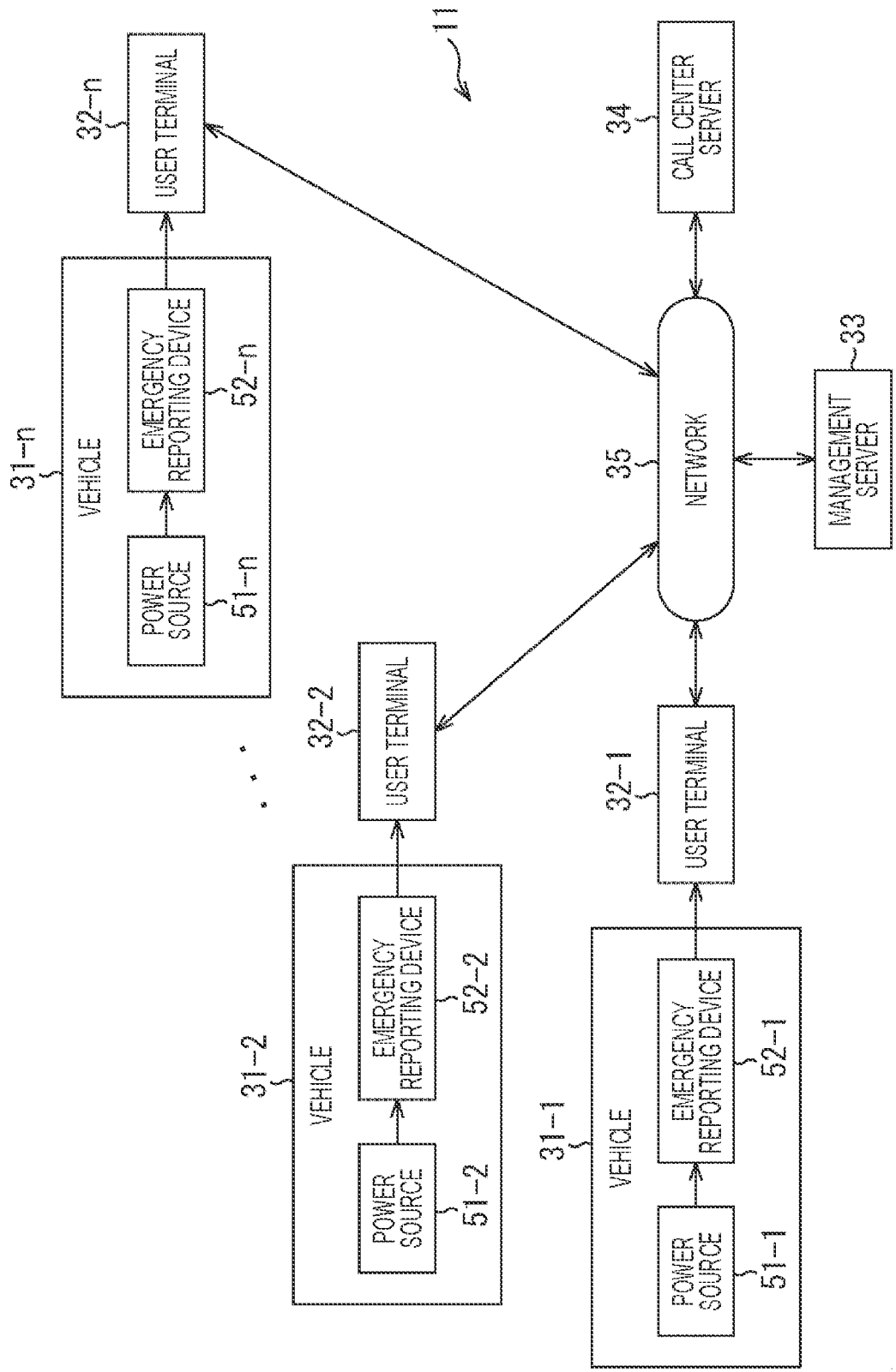
FIG. 2 is a diagram illustrating an emergency reporting system of the present disclosure.

An emergency reporting system 11 of FIG. 2 is a system that promptly reports the occurrence of an emergency to an automobile insurance company when the emergency situation occurs while a driver who is an automobile insurance contractor is driving a vehicle.

A specific configuration of the emergency reporting system 11 may be an emergency report service which is additionally provided by an application program installed in a user terminal possessed by a user when a discount service of insurance premiums of telematics automobile insurance is provided, or may be a service in which the emergency report service is provided alone. Here, the emergency reporting system 11 that provides only the emergency report service will be described.

The emergency reporting system 11 in FIG. 2 includes vehicles 31-1 to 31-n, user terminals 32-1 to 32-n, a management server 33, and a call center server 34.

Note that the vehicles 31-1 to 31-*n* and the user terminals 32-1 to 32-*n* are simply referred to as a vehicle 31 and a user terminal 32 in a case where it is not particularly necessary to distinguish them.

The vehicle 31 is a vehicle driven by a user who is a contractor of automobile insurance, and includes a power source 51 that generates power by operating an engine and supplies the power to the emergency reporting device 52, and the emergency reporting device 52 having an emergency report button 79 (FIG. 3) operated by the user in a case where an emergency situation occurs.

The power source 51 supplies power generated by the operation of the engine to the emergency reporting device 52 via, for example, an accessory socket or a USB terminal and the like provided inside the vehicle 31. The power source 51 incorporates, for example, a DC/DC converter (not illustrated), and converts a voltage of power generated by the vehicle 31 into a voltage that can be supplied to the emergency reporting device 52 and supplies the voltage.

The power source 51 supplies power in a state where the engine is operating, and basically does not supply power in a state where the engine is stopped.

The emergency reporting device 52 includes an emergency report button 79 (FIG. 3) operated by the driver who is an automobile insurance contractor in a case where an emergency situation occurs, and when the emergency report button 79 is operated, the user terminal 32 possessed by the user who is the driver is notified of the emergency report indicating that the emergency situation has occurred by short-range communication such as, for example, Bluetooth (registered trademark) and the like.

Since the emergency report button 79 is a button to be operated when an emergency situation occurs, the emergency report button is configured to be illuminated by an LED 73 and the like at a position with high visibility, for example, or has a shape with high operability in a manner that the operation can be reliably performed even in a state where the driver is confused.

Note that, in the present specification, the description will proceed on the assumption that the occurrence of an emergency is recognized by the driver declaring the occurrence of the emergency situation when the emergency report button 79 is operated, but a configuration other than the physical button may be used as long as the occurrence of the emergency can be recognized.

For example, when a voice such as scream is detected by a voice detected by a microphone and the like, it may be recognized that an emergency situation has occurred and an emergency report may be issued, or when it is recognized that an emergency situation has occurred from a recognition result of an image on the basis of an image captured by a camera and the like, an emergency report may be issued.

The emergency reporting device 52 includes a supercapacitor 76, and is driven by power supplied from the power source 51 and supplies power to the supercapacitor 76 to charge the supercapacitor 76 when the engine is operating and the power is supplied from the power source 51.

Furthermore, in a case where the engine is stopped, the emergency reporting device 52 is driven by the power charged by the supercapacitor 76.

Moreover, the emergency reporting device 52 measures, as the state information indicating the degree of deterioration according to the capacitance of the supercapacitor, the charging time from the start of the engine, the start of power supply from the power source 51, and the start of charging of the supercapacitor 76 serving as the power source provided inside the emergency reporting device 52 to the full charging, and notifies the user terminal 32 possessed by the user of the state information including the measured charging time.

The user terminal 32 is, for example, a mobile terminal such as a smartphone and the like possessed by a user who is an insurance contractor and drives the vehicle 31, and realizes the function of the present disclosure by installing an application program for realizing an emergency reporting system.

The user terminal 32 notifies the management server 33 of an emergency report indicating occurrence of an emergency situation supplied from the emergency reporting device 52 of the vehicle 31 and state information including the charging time of the supercapacitor 76 indicating the degree of deterioration of the emergency reporting device 52 via a network 35 including Wi-Fi, a public network, and the like.

The user terminal 32 includes a GPS device 159 (FIG. 4) that acquires position information of the vehicle, and transmits an emergency report to the management server 33 together with the position information when transmitting the emergency report to the management server 33.

The management server 33 is a server managed and operated by an automobile insurance company, and when acquiring an emergency report indicating that an emergency situation including the position information of the user terminal 32 has occurred, notifies the call center server 34 via the network 35.

At this time, the call center server 34 generates information for arranging to dispatch a staff member supporting the user in response to the emergency situation on the basis of the position information of the vehicle 31, notifies a terminal device (not illustrated) possessed by the staff member, and rushes to the vehicle 31 notified of the occurrence of the emergency situation.

At this time, the call center server 34 acquires position information detected by a terminal device (not illustrated) possessed by a staff member, generates an image including map information together with the position information of the vehicle 31, and notifies the user terminal 32 of the image via the management server 33.

Therefore, the user terminal 32 displays an image including the map information including the position information of the staff member and the vehicle 31.

The user possessing the user terminal 32 can grasp the time until the staff member supporting the user arrives on the basis of the displayed map information.

Furthermore, when the state information including the information on the charging time of the supercapacitor 76 is transmitted from the user terminal 32, the management server 33 estimates (evaluates) the reliability of the supercapacitor 76 on the basis of the charging time which is the state information, plots the estimation result (evaluation result) of the reliability, determines necessity of replacement of the emergency reporting device 52 on the basis of whether or not a predetermined period or more has elapsed after the evaluation value becomes lower than a predetermined threshold value, and notifies the call center server 34 of the result as the reliability estimation result.

At this time, when it is determined that the emergency reporting device 52 needs to be replaced on the basis of the reliability estimation result, the call center server 34 arranges a new emergency reporting device 52 to be replaced and causes the same to be delivered to the user, and notifies the user terminal 32 of information indicating that the current emergency reporting device 52 is to be replaced and the new emergency reporting device 52 is arranged via the management server 33.

When the user terminal 32 acquires information indicating that the current emergency reporting device 52 is at the time of replacement and a new emergency reporting device 52 is arranged, the information is displayed.

Therefore, the user of the user terminal 32 can recognize that the current reliability of the emergency reporting device 52 has deteriorated, the emergency reporting device 52 needs to be replaced, and the emergency reporting device 52 for replacement is arranged.

Configuration Example of Emergency Reporting Device

Next, a detailed configuration example of the vehicle 31 will be described with reference to FIG. 3.

The vehicle 31 includes the power source 51 and the emergency reporting device 52. The power source 51 functions when the engine of the vehicle 31 is operating, and supplies power to the emergency reporting device 52. The emergency reporting device 52 is a device that is operated when a user who is an insurance contractor and a driver issues an emergency report when an emergency situation occurs. Furthermore, the emergency reporting device 52 is configured to be attachable to and detachable from the vehicle 31, and needs to be replaced due to aging deterioration.

The emergency reporting device 52 includes a diode 71, a chip set 72, the light emitting diode (LED) 73, a transistor 74, a charging gate transistor 75, the supercapacitor 76, a transistor 77, a resistor 78, the emergency report button 79, and an antenna 80.

The diode 71 rectifies power supplied from the power source 51 and supplies the rectified power to the chip set 72, the LED 73, the charging gate transistor 75, and the resistor 78.

The chip set 72 is a Bluetooth Low Energy (BLE) chipset, is driven by power from the power source 51, and transmits an emergency report indicating that an emergency situation has occurred and state information including a charging time of the supercapacitor 76 to the user terminal 32 by communication such as Bluetooth (registered trademark) and the like from the antenna 80.

The chip set 72 includes terminals 72a to 72f.

The terminal 72a is connected to the diode 71, monitors the voltage of the power supplied from the power source 51, monitors whether or not the power supply from the power source 51 is received, and receives the power supply from the power source 51 when the power supply is received. Furthermore, when the power supply from the power source 51 is stopped, the supply of the power charged by the supercapacitor 76 is received.

The terminal 72b is connected to the supercapacitor 76, and monitors the charging voltage of the supercapacitor 76 when the supercapacitor is powered on or charged.

The terminal 72c is connected to the gate of the transistor 77, and controls on or off of the charging gate transistor 75 by controlling on/off of the transistor 77. More specifically, the terminal 72c turns on the transistor 77 and turns on the charging gate transistor 75, in a manner that the gate of 75 is closed and the voltage supplied from the power source 51 is not supplied to the supercapacitor 76. At this time, the voltage measured at 72b is nothing other than the initial voltage accumulated in the supercapacitor 76. Furthermore, the terminal 72c turns off the transistor 77 and turns off the charging gate transistor 75, in a manner that the gate of 75 is empty and the supercapacitor 76 is charged with the power supplied from the power source 51. At this time, the time is measured at 93 until the voltage measured at 72b reaches the maximum voltage that can be accumulated in the supercapacitor 76.

The terminal 72d is connected to the emergency report button 79, and detects on or off of the emergency report button 79.

The terminal 72e is connected to the antenna 80, and is used for communication with the user terminal 32 by communication such as Bluetooth (registered trademark) and the like.

The terminal 72f is connected to the gate of the transistor 74, and controls on or off of the transistor 74 to control light emission or off of the LED 73.

Moreover, the chip set 72 includes a power source switching unit 91, a state measurement unit 92, and a report processing unit 93 as configurations for realizing the functions.

The power source switching unit 91 monitors the terminal 72a to monitor whether or not power is supplied from the power source 51, and stops the application of the voltage of 72c and the monitoring of the capacitor power at 72b according to the monitoring state.

In a case where the engine is started, the state measurement unit 92 turns on the transistor 77 connected to the terminal 72c and turns on the charging gate transistor 75. Then, the gate of 75 is closed, and the voltage supplied from the power source 51 is not supplied to the supercapacitor 76. At this time, the voltage measured at 72b is nothing other than the initial voltage accumulated in the supercapacitor 76. Thereafter, the terminal 72c turns off the transistor 77 and turns off the charging gate transistor 75, in a manner that the gate of 75 is empty and the supercapacitor 76 is charged with the power supplied from the power source 51. At this time, the time is measured at 93 until the voltage measured at 72b reaches the maximum voltage that can be accumulated in the supercapacitor 76.

Then, the state measurement unit 92 monitors the charge start voltage of the supercapacitor 76 at the terminal 72b from the timing of the start of charging of the supercapacitor 76, and measures the time until the charging voltage reaches the charging voltage regarded as full charge, measuring state information that is the charging time of the supercapacitor 76.

The report processing unit 93 monitors the voltage of the terminal 92d, monitors whether or not the emergency report button 79 is operated, and notifies the user terminal 32 of an emergency report indicating that an emergency situation has occurred via the antenna 80 of the terminal 72e when the emergency report button is operated.

Furthermore, when the emergency report button 79 is operated, the report processing unit 93 turns on the LED 73 by controlling the gate voltage of the transistor 74 connected to the terminal 72f, visually recognizing that the emergency report button 79 is operated.

Moreover, when the state measurement unit 92 measures the state information including the charging time of the supercapacitor 76, the report processing unit 93 notifies the user terminal 32 via the antenna 80 of the terminal 72e.

Configuration Example of User Terminal

Next, a configuration example of the user terminal 32 will be described with reference to FIG. 4.

The user terminal 32 includes a control unit 151, an input unit 152, an output unit 153, a storage unit 154, a communication unit 155, a drive 156, a removable storage medium 157, and a GPS device 159, and is connected to each other via a bus 158, and can transmit and receive data and programs.

The control unit 151 includes a processor and a memory, and controls the entire operation of the user terminal 32. Furthermore, the control unit 151 includes a state information processing unit 171 and a report processing unit 172.

The state information processing unit 171 controls the communication unit 155 to determine whether or not state information including the charging time of the supercapacitor 76 has been transmitted from the emergency reporting device 52 by short-range communication such as Bluetooth (registered trademark) and the like.

Then, in a case where the state information is transmitted, the state information processing unit 171 acquires the state information and controls the communication unit 155 to transmit the state information to the management server 33 via the network 35 with information for identifying the state information processing unit 171.

Furthermore, on the basis of the state information, in a case where the deterioration of the emergency reporting device 52 has progressed, the replacement timing has come, and information indicating that the emergency reporting device 52 for replacement has been arranged has been transmitted, the state information processing unit 171 controls the communication unit 155, receives the information to that effect, and displays the information on the display and the like constituting the output unit 153.

The report processing unit 172 controls the communication unit 155 to determine whether or not the emergency report has been transmitted from the emergency reporting device 52, and in a case where the emergency report has been transmitted, the report processing unit 172 acquires the emergency report and acquires its own position information by controlling the GPS 159, and controls the communication unit 155 to transmit information indicating that the emergency report has been received, the position information, the contractor information, and the like together to the management server 33 via the network 35.

Furthermore, when the state information processing unit 171 acquires, from the call center server 34 via the management server 33 on the basis of the emergency report, map information including position information of a staff member for support for coping with an emergency situation and its own position information, the state information processing unit 171 displays the map information on a display and the like constituting the output unit 153.

The input unit 152 includes an input device such as a keyboard, a mouse, and the like with which the user inputs an operation command, and supplies various input signals to the control unit 151.

The output unit 153 is controlled by the control unit 151, and outputs a supplied operation screen and an image of a processing result to a display device including a liquid crystal display (LCD), an organic electro luminescence (EL), and the like for display.

The storage unit 154 includes a hard disk drive (HDD), a solid state drive (SSD), a semiconductor memory, and the like, is controlled by the control unit 151, and writes or reads various data and programs including content data.

The communication unit 155 is controlled by the control unit 151, realizes communication represented by a local area network (LAN), Bluetooth (registered trademark), and the like in a wired or wireless manner, and transmits and receives various data and programs to and from various devices via the network 35 as necessary.

The drive 156 reads and writes data from and to the removable storage medium 157 such as a magnetic disk (including a flexible disk), an optical disk (including a compact disc-read only memory (CD-ROM) and a digital versatile disc (DVD)), a magneto-optical disk (including a mini disc (MD)), or a semiconductor memory and the like.

The GPS 159 is controlled by the control unit 151, receives signals from a plurality of satellites not illustrated, detects position information on the earth (for example, latitude information and minor information) on the basis of the received signals from the plurality of satellites, and supplies the position information to the control unit 151.

Configuration Example of Management Server

Next, a configuration example of the management server 33 will be described with reference to FIG. 5.

The management server 33 includes a control unit 191, an input unit 192, an output unit 193, a storage unit 194, a communication unit 195, a drive 196, and 1 removable storage medium 97, and is connected to each other via a bus 198, and can transmit and receive data and programs.

The control unit 191 includes a processor and a memory, and controls the entire operation of the management server 33. Furthermore, the control unit 191 includes an information separation unit 201, a reliability estimation unit 202, and a report processing unit 203.

When receiving the emergency report of the user terminal 32 including the position information and the state information including the charging time of the supercapacitor 76 by controlling the communication unit 195, the information separation unit 201 recognizes each of them, supplies the emergency report from the user terminal 32 including the position information to the report processing unit 203, and supplies the state information including the charging time of the supercapacitor 76 to the reliability estimation unit 202.

The reliability estimation unit 202 estimates the reliability of the emergency reporting device 52 on the basis of the state information including the charging time of the supercapacitor 76, and controls the communication unit 195 to transmit the estimation result to the call center server 34.

Note that a method of estimating the reliability of the emergency reporting device 52 based on the state information including the charging time of the supercapacitor 76 in the reliability estimation unit 202 will be described later with reference to FIG. 6.

Then, when information indicating that the emergency reporting device 52 needs to be replaced and the emergency reporting device 52 for replacement is arranged is supplied from the call center server 34 on the basis of the reliability estimation result, the reliability estimation unit 202 controls the communication unit 195 to notify the user terminal 32 of the information.

The report processing unit 203 controls the communication unit 195 to transmit an emergency report from the user terminal 32 including the position information to the call center server 34.

Then, on the basis of the emergency report from the user terminal 32 including the position information, when the map information including the position information of the staff member for supporting the emergency situation of the user of the vehicle 31 and the position information of the vehicle 31 in which the emergency situation has occurred is supplied from the call center server 34, the report processing unit 203 controls the communication unit 195 to notify the user terminal 32 of the map information.

The input unit 192 includes an input device such as a keyboard, a mouse, and the like with which the user inputs an operation command, and supplies various input signals to the control unit 191.

The output unit 193 is controlled by the control unit 191, and outputs a supplied operation screen and an image of a processing result to a display device including a liquid crystal display (LCD), an organic electro luminescence (EL), and the like for display.

The storage unit 194 includes a hard disk drive (HDD), a solid state drive (SSD), a semiconductor memory, and the like, is controlled by the control unit 191, and writes or reads various data and programs including content data.

The communication unit 195 is controlled by the control unit 191, and transmits and receives various data and programs to and from various devices via a communication network represented by a local area network (LAN) and the like in a wired (or wireless (not illustrated)) manner.

The drive 196 reads and writes data from and to the removable storage medium 197 such as a magnetic disk (including a flexible disk), an optical disk (including a compact disc-read only memory (CD-ROM) and a digital versatile disc (DVD)), a magneto-optical disk (including a mini disc (MD)), or a semiconductor memory and the like.

<Estimation Method of Reliability>

Here, a method of estimating the reliability of the emergency reporting device 52 by the reliability estimation unit 202 will be described.

The reliability estimation unit 202 computes an evaluation value E (T) expressed by the following formula (1) on the basis of a charging time T of the supercapacitor 76, which is the state information, evaluates the reliability of the emergency reporting device 52 on the basis of whether or not the evaluation value E (T) is higher than an evaluation threshold value Eth expressed by the formula (2), and determines whether or not replacement of the emergency reporting device 52 is necessary on the basis of the evaluation result.

[Mathematical formula 1]

$$E(T) = (T - T') \quad (1)$$

[Mathematical formula 2]

$$Eth = \frac{RC}{\log\left(1 - \frac{V}{e}\right)} \quad (2)$$

Here, E (T) is an evaluation value, T is a charging time (measurement time) to full charge, and T' is a theoretical charging time when charging to capacitance when the supercapacitor 76 is deteriorated to a state requiring replacement.

Furthermore, Eth is the evaluation threshold value, V is the charging voltage (measured voltage) of the supercapacitor 76 when the engine starts, C is the capacitance when the supercapacitor 76 has deteriorated to a state where replacement should be considered, R is a resistance value of the charging time control resistor, and e is a natural logarithm.

That is, the supercapacitor 76 deteriorates as the capacitance gradually decreases as the dielectric of the liquid evaporates over time.

Then, the charging time T of the supercapacitor 76 decreases as the capacitance decreases.

Figure 6:
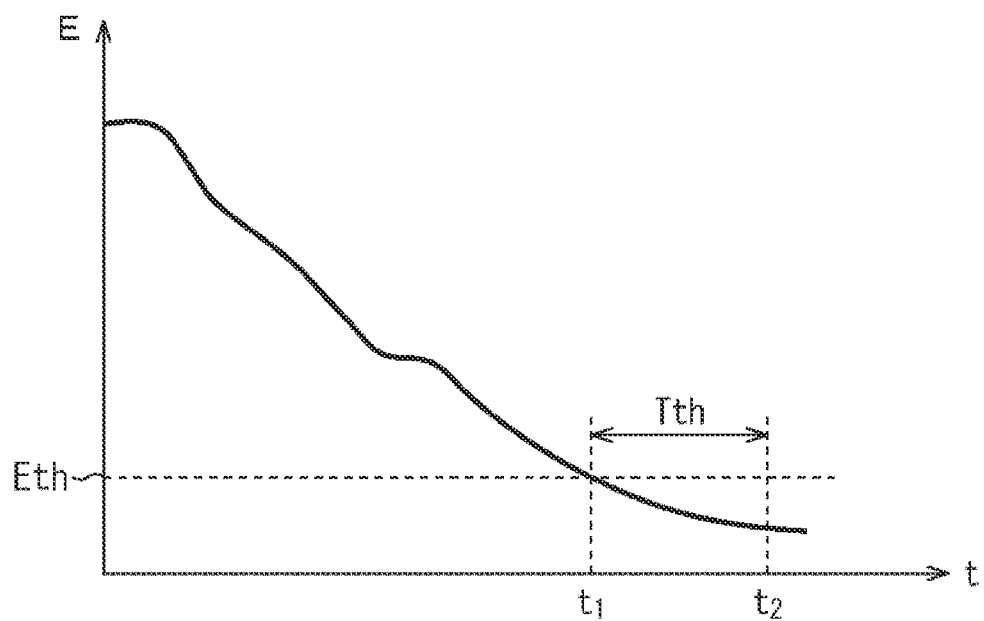
FIG. 6 is a diagram illustrating a reliability evaluation method.

As a result, as shown in FIG. 6, the evaluation value E (T) gradually decreases as the charging time T decreases as the deterioration progresses with the lapse of time t.

Therefore, the reliability estimation unit 202 plots the evaluation value E (T) with the lapse of time t in FIG. 6, and determines whether or not it is necessary to replace the emergency reporting device 52 on the basis of whether or not a predetermined period Tth or more has elapsed after the evaluation value E (T) becomes smaller than the evaluation threshold value Eth.

Here, the evaluation threshold value Eth is the evaluation value E (T) at the time when the capacitance has deteriorated to a state where replacement of the emergency reporting device 52 including the supercapacitor 76 should be considered.

Furthermore, the predetermined period Tth is a period in which the emergency reporting device 52 including the supercapacitor 76 is allowed to be used without being replaced in a state in which the evaluation value E (T) is lower than the evaluation threshold value Eth, that is, in a state in which the emergency reporting device 52 including the supercapacitor 76 is deteriorated to a state in which replacement of the emergency reporting device 52 including the supercapacitor is to be considered.

Therefore, values corresponding to the performance of the supercapacitor 76 are set for the evaluation threshold value Eth and the predetermined period Tth.

In the example of FIG. 6, the evaluation value E (T) is calculated and repeatedly plotted every time the engine is started, and thus, the evaluation value E (T) becomes smaller than the evaluation threshold value Eth at a time t1, and in a state where the evaluation value E (T) is smaller than the evaluation threshold value Eth, until a time t2 at which the predetermined period Tth elapses from the time t1, an estimation result in which the reliability of (the supercapacitor 76 of) the emergency reporting device 52 is considered to be sufficient is output as the reliability estimation result.

Then, after the time t2 at which the predetermined period Tth elapses after the evaluation value E (T) becomes smaller than the evaluation threshold value Eth, the reliability of (the supercapacitor 76 of) the emergency reporting device 52 is considered to be insufficient as the reliability estimation result, and the estimation result indicating that the emergency reporting device 52 needs to be replaced is output.

Configuration Example of Call Center Server

Next, a configuration example of the call center server 34 will be described with reference to FIG. 7.

The call center server 34 includes a control unit 221, an input unit 222, an output unit 223, a storage unit 224, a communication unit 225, a drive 226, and a removable storage medium 227, and is connected to each other via a bus 228, and can transmit and receive data and programs.

Note that the configuration of the call center server 34 is basically similar to that of the management server 33, and the control unit 221, the input unit 222, the output unit 223, the storage unit 224, the communication unit 225, the drive 226, the removable storage medium 227, and the bus 228 correspond to the control unit 191, the input unit 192, the output unit 193, the storage unit 194, the communication unit 195, the drive 196, the removable storage medium 197, and the bus 198, respectively, and thus, detailed description is omitted.

However, the control unit 221 includes a reliability processing unit 231 and a report processing unit 232 instead of the information separation unit 201, the reliability estimation unit 202, and the report processing unit 203 in the control unit 191.

When the reliability estimation result is received from the management server 33 by controlling the communication unit 225, the reliability processing unit 231 arranges a new emergency reporting device 52 for replacement and causes the same to be delivered to the user of the corresponding vehicle 31 when replacement of the emergency reporting device 52 is necessary on the basis of the reliability estimation result.

At this time, the reliability processing unit 231 controls the communication unit 225 to transmit, to the user terminal 32 via the management server 33, information indicating that the current reliability of the emergency reporting device 52 has deteriorated due to aging and thus needs to be replaced, and delivery of a new emergency reporting device 52 for replacement has been arranged.

When the emergency report including the position information is transmitted via the management server 33, the report processing unit 232 controls and receives the communication unit 225.

Then, the report processing unit 232 gives instruction on dispatch of a staff member for support on the basis of the position information of the vehicle 31 that has transmitted the emergency report, generates map information including the position information of the staff member detected by a terminal device carried by the staff member and the position information of the vehicle 31 in which the emergency situation has occurred, controls the communication unit 225, and transmits the map information to the user terminal 32 via the management server 33.

Figure 8:
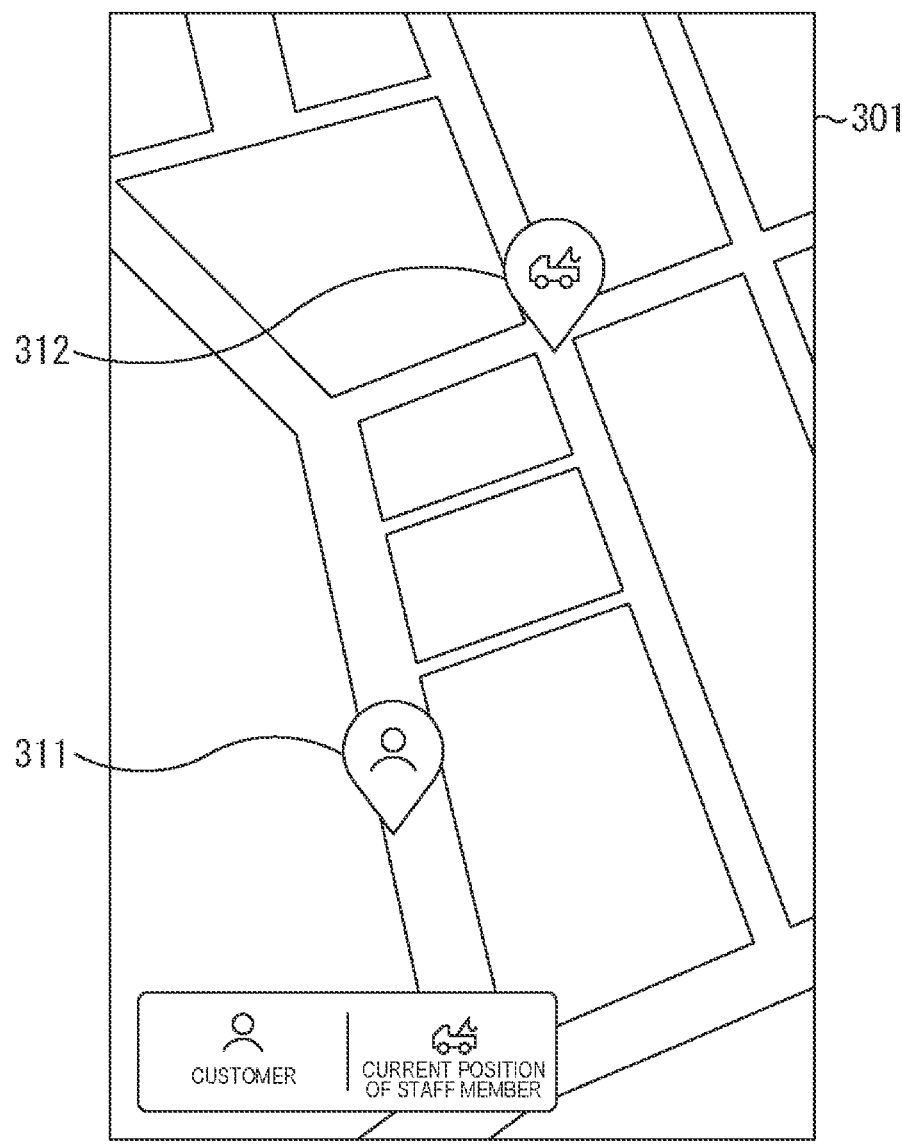
FIG. 8 is a diagram illustrating map information.

The map information is, for example, information as illustrated in FIG. 8, and map information 301 in FIG. 8 includes an icon 311 indicating the position of the vehicle 31 of the user in which the emergency situation has occurred and an icon 312 indicating the position of the staff member toward the support.

By displaying the map information as illustrated in FIG. 8 on the user terminal 32, the user in an emergency situation can grasp when the staff member toward the support will arrive.

<Emergency Report Management Processing>

Next, an emergency report management processing in the emergency reporting system 11 of FIG. 2 will be described with reference to flowcharts of FIGS. 9 to 12.

Figure 9:
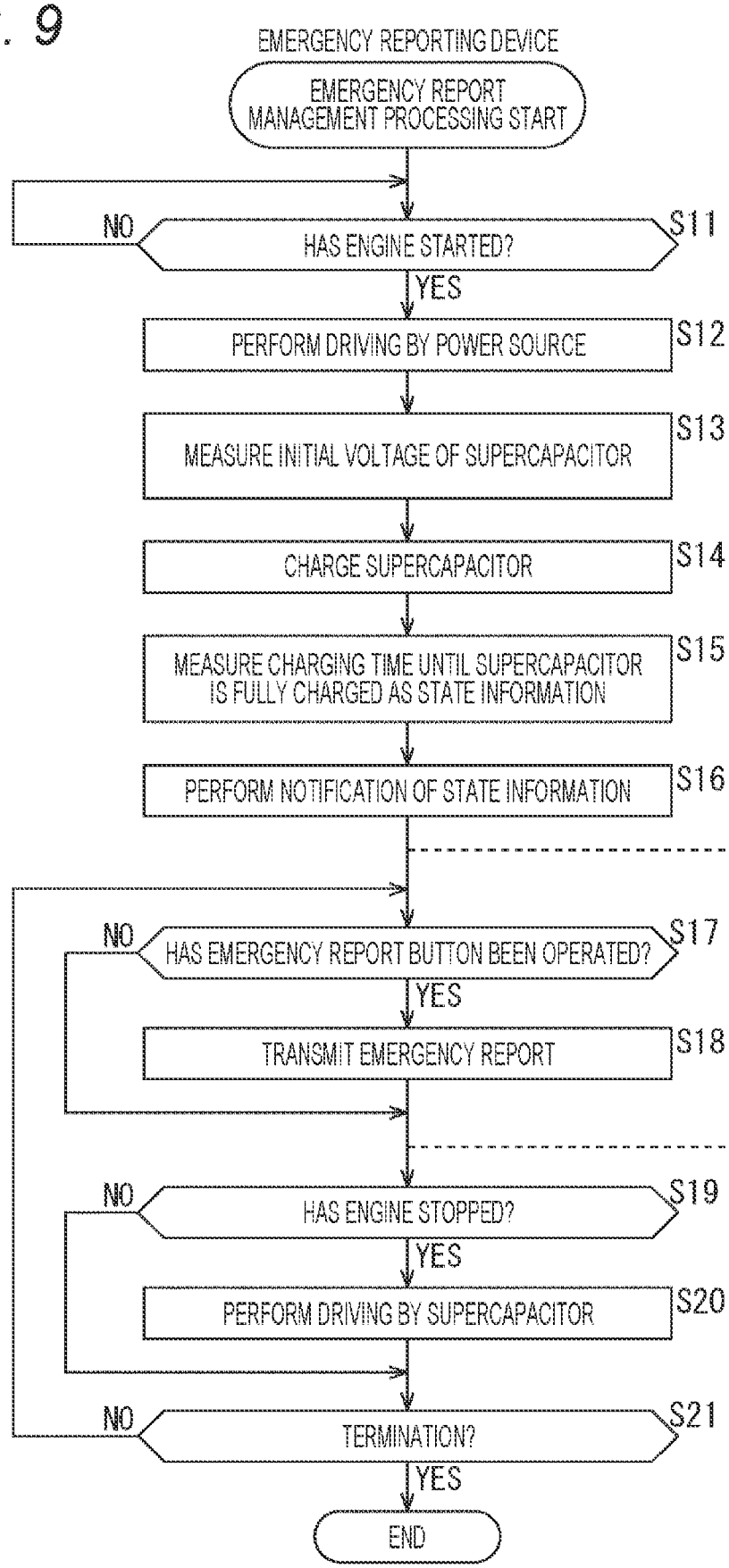
FIG. 9 is a flowchart illustrating an emergency report management processing by the emergency reporting device in FIG. 3.
Figure 10:
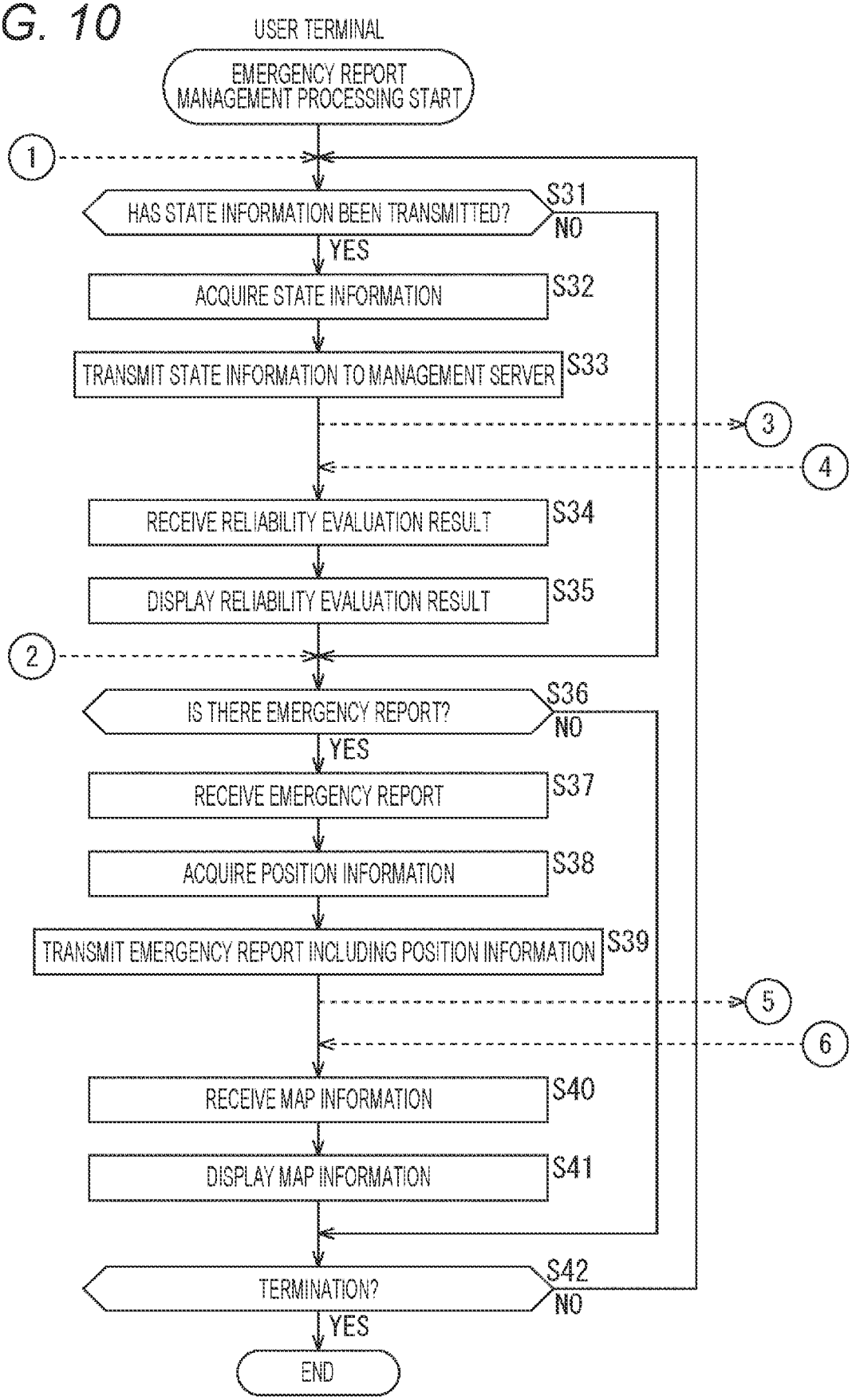
FIG. 10 is a flowchart illustrating an emergency report management processing by the user terminal in FIG. 4.
Figure 11:
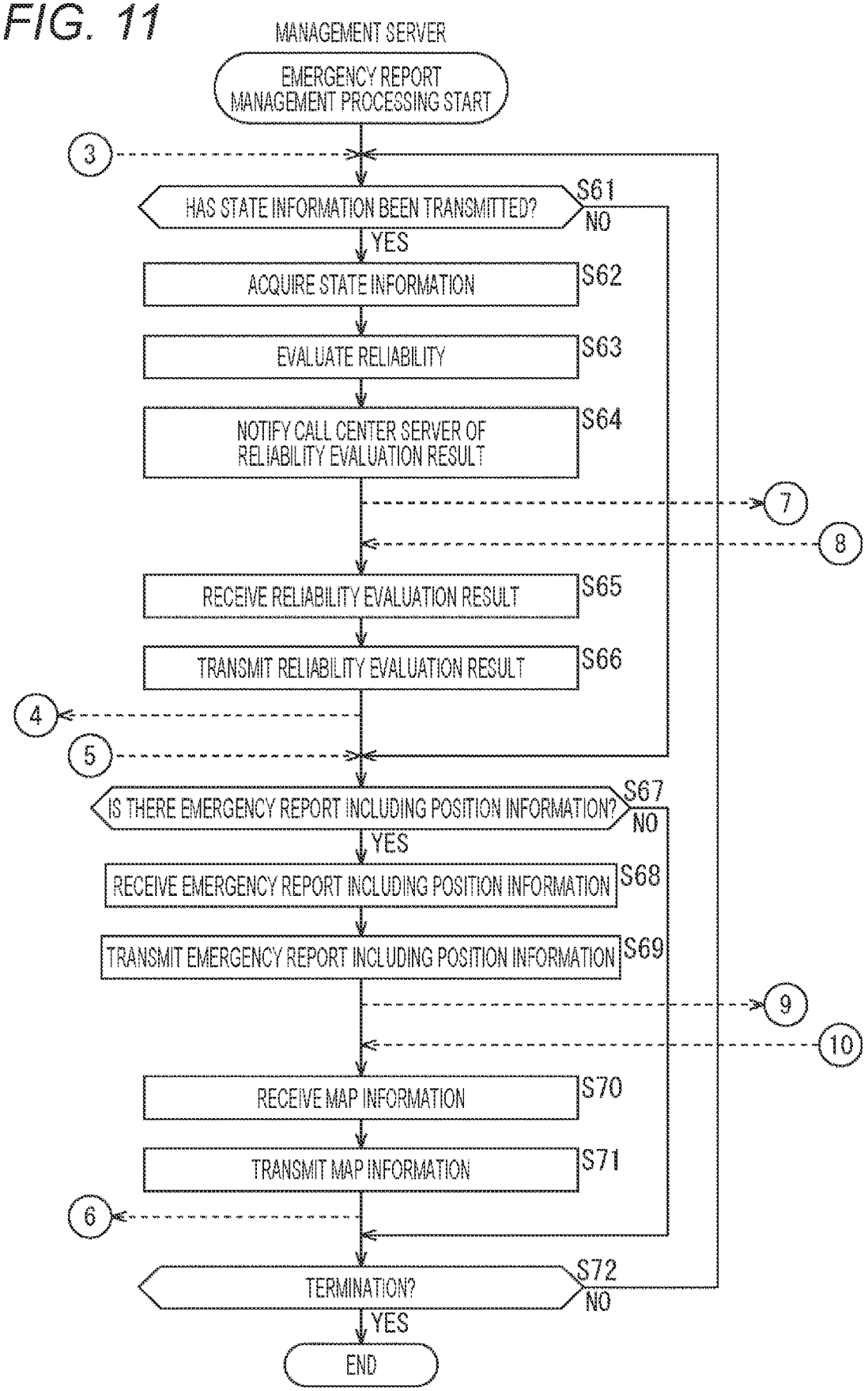
FIG. 11 is a flowchart illustrating an emergency report management processing by the management server in FIG. 5.
Figure 12:
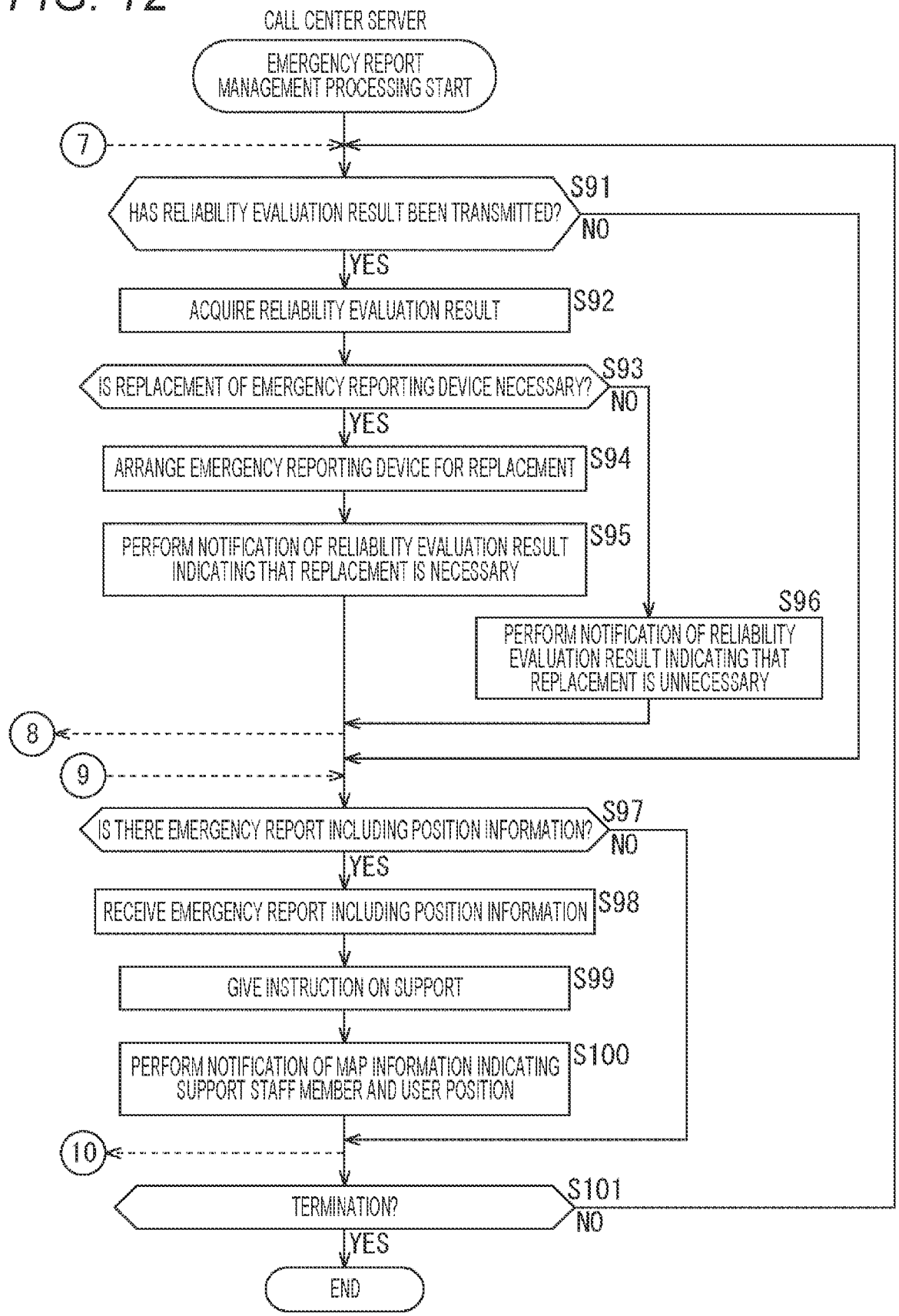
FIG. 12 is a flowchart illustrating an emergency report management processing by the call center server in FIG. 7.

Note that FIG. 9 illustrates processing of the emergency reporting device 52 in the vehicle 31, FIG. 10 illustrates processing of the user terminal 32, FIG. 11 illustrates processing of the management server 33, and FIG. 12 illustrates processing of the call center server 34.

In step S11 (FIG. 9), the state measurement unit 92 of the emergency reporting device 52 monitors the voltage of the terminal 72*a*, determines whether or not the engine is started and the power supply from the power source 51 is started, and repeats the similar processing until the power supply from the power source 51 is started.

In a case where it is determined in step S11 that the power supply from the power source 51 is started, the processing proceeds to step S12.

In step S12, the power source switching unit 91 is driven by power supplied from the power source 51 via the terminal 72*a*.

In step S13, the state measurement unit 92 monitors the terminal 72*b* and measures the initial voltage of the supercapacitor 76.

In step S14, the state measurement unit 92 controls the terminal 72*c* to turn on the transistor 77, turning on the charging gate transistor via the resistor 78 and starting charging the supercapacitor 76.

In step S15, the state measurement unit 92 further monitors the voltage of the terminal 72*b* to monitor the charging voltage of the supercapacitor 76, measures the charging time until the supercapacitor is fully charged, and outputs the charging time to the report processing unit 93 as state information.

In step S16, the report processing unit 93 transmits information on the measured charging time of the supercapacitor 76 as state information to the user terminal 32 through communication such as Bluetooth (registered trademark) and the like via the antenna 80.

In step S31 (FIG. 10), the state information processing unit 171 of the user terminal 32 controls the communication unit 155 to determine whether or not the information on the charging time of the supercapacitor 76 as the state information has been transmitted from the emergency reporting device 52 by communication such as Bluetooth (registered trademark) and the like.

In a case where it is determined in step S31 that the information on the charging time of the supercapacitor 76 as the state information has been transmitted from the emergency reporting device 52, the processing proceeds to step S32.

In step S32, the state information processing unit 171 controls the communication unit 155 to acquire state information including the information on the charging time of the supercapacitor 76 transmitted from the emergency reporting device 52.

In step S33, the state information processing unit 171 controls the communication unit 155 to transmit state information including information on the charging time of the supercapacitor 76 to the management server 33 via the network 35.

In step S61 (FIG. 11), the information separation unit 201 controls the communication unit 195 to determine whether or not the information on the charging time of the supercapacitor 76 as the state information has been transmitted from the user terminal 32 via the network 35.

In a case where it is determined in step S61 that the information on the charging time of the supercapacitor 76 as the state information has been transmitted from the user terminal 32, the processing proceeds to step S62.

In step S62, the information separation unit 201 controls the communication unit 195 to receive the state information including the information on the charging time of the supercapacitor 76 transmitted from the management server 33, and outputs the state information to the reliability estimation unit 202.

In step S63, the reliability estimation unit 202 obtains an evaluation value E representing the reliability of the emergency reporting device 52 by calculating formula (1) described above, and compares the evaluation value E with the evaluation threshold value Eth defined by formula (2) to evaluate the evaluation value E.

More specifically, the reliability estimation unit 202, the reliability estimation unit 202 calculates formula (1) described above to obtain and plot the evaluation value E representing the reliability of the emergency reporting device 52 in time series, estimates whether or not the reliability of the emergency reporting device 52 is sufficient on the basis of whether or not the predetermined period Tth has elapsed after the evaluation value E has become lower than the evaluation threshold value Eth, and determines necessity of replacement.

Here, the reliability evaluation result by the reliability estimation unit 202 is information indicating whether or not the reliability is low and replacement is necessary from the estimation result indicating the reliability of the emergency reporting device 52.

In step S64, the reliability estimation unit 202 controls the communication unit 195 to transmit a reliability evaluation result to the call center server 34 via the network 35, the reliability evaluation result being information indicating whether or not the emergency reporting device 52 is low in reliability and needs to be replaced.

In step S91 (FIG. 12), the reliability processing unit 231 of the call center server 34 controls the communication unit 225 to determine whether or not the reliability evaluation result has been transmitted from the management server 33.

In a case where it is determined in step S91 that the reliability evaluation result has been transmitted from the management server 33, the processing proceeds to step S92.

In step S92, the reliability processing unit 231 controls the communication unit 225 to receive the reliability evaluation result transmitted from the management server 33.

In step S93, the reliability processing unit 231 determines whether or not the reliability evaluation result is information that the reliability of the emergency reporting device 52 is low and replacement is necessary.

In step S93, in a case where the reliability evaluation result is information indicating that the reliability of the emergency reporting device 52 is low and replacement is necessary, the processing proceeds to step S94.

In step S94, the reliability processing unit 231 gives instruction on arrangement of the emergency reporting device 52 for replacing the emergency reporting device 52 indicating that the reliability is low and the replacement is necessary, and causes the emergency reporting device 52 for replacement to be delivered to the user who is the corresponding insurance contractor by home delivery.

In step S95, the reliability processing unit 231 controls the communication unit 225 to transmit a notification indicating that the emergency reporting device 52 for replacement has been arranged with the reliability evaluation result indicating that the reliability of the emergency reporting device 52 is low and replacement is necessary, to the management server 33 via the network 35.

On the other hand, in step S93, in a case where the reliability evaluation result is information indicating that the reliability of the emergency reporting device 52 is sufficient and replacement is unnecessary, the processing proceeds to step S96.

In step S96, the reliability processing unit 231 controls the communication unit 225 to transmit the reliability evaluation result indicating that the emergency reporting device 52 does not need to be replaced to the management server 33 via the network 35.

In step S65 (FIG. 11), the reliability estimation unit 202 controls the communication unit 195 to receive the reliability evaluation result indicating the necessity of replacement of the emergency reporting device 52 transmitted from the call center server 34 via the network 35.

In step S66, the reliability estimation unit 202 controls the communication unit 195 to transmit the reliability evaluation result indicating the necessity of replacement of the emergency reporting device 52 to the user terminal 32 via the network 35.

Note that, since the reliability evaluation result is information generated in the management server 33, the reliability evaluation result may be transmitted from the management server 33 to the user terminal 32 without waiting for notification from the call center server 34.

In step S34 (FIG. 10), the state information processing unit 171 controls the communication unit 155 to receive the reliability evaluation result indicating the necessity of replacement of the emergency reporting device 52 transmitted from the management server 33 via the network 35.

In step S35, the state information processing unit 171 displays the received reliability evaluation result indicating the necessity of replacement of the emergency reporting device 52 on the display of the output unit 153.

With the processing so far, when the engine is started, the initial voltage of the supercapacitor 76 of the emergency reporting device 52 is measured and charging is started, the charging time until full charging is measured, and the user terminal 32 is transmitted to the management server 33.

The management server 33 evaluates reliability of the emergency reporting device 52 based on the charging time, generates information indicating necessity of replacement of the emergency reporting device 52 as a reliability evaluation result on the basis of the evaluation result, and transmits the reliability evaluation result to the call center server 34.

The call center server 34 generates reliability evaluation information indicating necessity of replacement of the emergency reporting device 52 on the basis of the reliability evaluation result, and transmits the reliability evaluation information to the user terminal 32 via the management server 33.

The user terminal 32 displays information indicating necessity of replacement of the emergency reporting device 52 as a reliability evaluation result based on the charging time until the supercapacitor 76 of the emergency reporting device 52 is fully charged.

Therefore, it is possible to identify the emergency reporting device 52 that needs to be replaced according to the degree of deterioration from the reliability evaluation result based on the charging time of the supercapacitor 76 of the emergency reporting device 52.

As a result, it is possible to reduce the cost and replace the deteriorated emergency reporting device 52 at an appropriate timing while maintaining the reliability.

Furthermore, in step S17 (FIG. 9), the report processing unit 93 monitors the voltage of the terminal 72c and determines whether or not the emergency report button 79 has been operated.

In a case where it is determined in step S17 that the emergency report button 79 has been operated, the processing proceeds to step S18.

In step S18, the report processing unit 93 transmits an emergency report indicating that the emergency report button 79 has been operated by communication such as Bluetooth (registered trademark) and the like to the user terminal 32 via the antenna 80.

In step S36 (FIG. 10), the report processing unit 172 controls the communication unit 155 to determine whether or not an emergency report has been transmitted from the emergency reporting device 52 by communication such as Bluetooth (registered trademark) and the like.

In a case where the emergency report is transmitted in step S36, the processing proceeds to step S37.

In step S37, the report processing unit 172 controls the communication unit 155 to acquire the emergency report transmitted from the emergency reporting device 52 by communication such as Bluetooth (registered trademark) and the like.

In step S38, the report processing unit 172 controls the GPS 159 to acquire its own position information.

In step S39, the report processing unit 172 controls the communication unit 155 to transmit the emergency report including the position information to the management server 33 via the network 35.

In step S67 (FIG. 11), the information separation unit 201 controls the communication unit 195 to determine whether or not an emergency report has been transmitted from the user terminal 32 via the network 35.

In a case where the emergency report is transmitted in step S67, the processing proceeds to step S68.

In step S68, the information separation unit 201 controls the communication unit 195 to receive the emergency report including the position information transmitted from the user terminal 32 via the network 35.

In step S69, the information separation unit 201 controls the communication unit 195 to transmit an emergency report including the position information to the call center server 34 via the network 35.

In step S97 (FIG. 12), the report processing unit 232 controls the communication unit 225 to determine whether or not an emergency report including the position information has been transmitted from the management server 33 via the network 35.

In a case where the emergency report including the position information is transmitted in step S97, the processing proceeds to step S98.

In step S98, the report processing unit 232 controls the communication unit 225 to receive the emergency report including the position information transmitted from the management server 33 via the network 35.

In step S99, the report processing unit 232 identifies the position of the vehicle 31 that has transmitted the emergency report on the basis of the position information, and generates information instructing the staff member to support the insurance contractor who is the driver of the vehicle 31 that has issued the emergency report.

That is, by this processing, a staff member for supporting the driver of the vehicle 31 who has made the emergency report is dispatched.

In step S100, the report processing unit 232 acquires the position information detected by the mobile terminal possessed by the assisting staff member, generates the map information including the position information of the vehicle 31 that has transmitted the emergency report and the position information of the staff member toward the support, and controls the communication unit 225 to transmit the map information to the management server 33 via the network 35.

Note that, in step S91, in a case where the reliability evaluation result has not been transmitted, the processing of steps S92 to S96 is skipped. Furthermore, in a case where there is no emergency report in step S97, the processing of steps S98 to S100 is skipped.

Moreover, in step S101, the report processing unit 203 determines whether or not an instruction on termination has been given, and in a case where the instruction on termination has not been given, the processing returns to step S91. That is, the processing of steps S91 to S101 is repeated until instruction on termination is given.

Then, in step S101, when instruction on termination is given, the processing is terminated.

Furthermore, in step S70 (FIG. 11), the report processing unit 203 controls the communication unit 195 to acquire map information transmitted from the call center server 34 via the network 35.

In step S71, the report processing unit 203 controls the communication unit 195 to transmit the acquired map information to the user terminal 32 via the network 35.

Note that, in step S61, in a case where the state information has not been transmitted, the processing of steps S62 to S66 is skipped. Furthermore, in a case where there is no emergency report in step S67, the processing of steps S68 to S71 is skipped.

Moreover, in step S72, the report processing unit 172 determines whether or not an instruction on termination has been given, and in a case where the instruction on termination has not been given, the processing returns to step S61. That is, the processing of steps S61 to S72 is repeated until instruction on termination is given.

Then, in step S72, when instruction on termination is given, the processing is terminated.

Furthermore, in step S40 (FIG. 10), the report processing unit 172 controls the communication unit 155 to acquire map information transmitted from the management server 33 via the network 35.

In step S41, the report processing unit 172 controls the communication unit 155 to display the acquired map information as an image as illustrated in FIG. 8 on the display of the output unit 153, for example.

Note that, in step S31, in a case where the state information has not been transmitted, the processing of steps S32 to S35 is skipped. Furthermore, in a case where there is no emergency report in step S36, the processing of steps S37 to S41 is skipped.

Moreover, in step S42, the report processing unit 172 determines whether or not an instruction on termination has been given, and in a case where the instruction on termination has not been given, the processing returns to step S31. That is, the processing of steps S31 to S42 is repeated until instruction on termination is given.

Then, in step S42, when instruction on termination is given, the processing is terminated.

Through the above series of processings, when the emergency report button 79 is operated in the emergency reporting device 52, the emergency report is notified to the user terminal 32.

When notified of the emergency report, the user terminal 32 acquires the position information of the vehicle 31, and notifies the call center server 34 of the emergency report with the position information via the management server 33.

Upon receiving the emergency report, the call center server 34 arranges dispatch of the support staff member on the basis of the included position information, acquires the position information detected by the mobile terminal carried by the support staff member, generates map information including the position information of the vehicle 31 on which the emergency report has been issued and the position information of the staff member toward the support, and transmits the map information to the user terminal 32 via the management server 33.

In the user terminal 32, map information including own position information and position information of the staff member toward the support is displayed.

As a result, it is possible to quickly make an emergency report and visually recognize the map information including the staff member dispatched for support and its own position information, and it is possible to grasp when the staff member will arrive.

Therefore, it is possible for the user who has operated the emergency report button 79 to quickly present information that the user wants to know the most in a case where an emergency situation such as whether or not a support staff member will come, or how long it takes if the support staff comes, and it is possible to alleviate the uneasy psychological state of the user in a case where the emergency situation occurs.

Furthermore, in step S18 (FIG. 9), the power source switching unit 91 monitors the voltage of the terminal 72a and determines whether or not the engine has stopped and there is no power supply from the power source 51.

In a case where it is determined in step S18 that the engine is stopped and the power supply from the power source 51 is stopped, the processing proceeds to step S19.

In step S19, the power source switching unit 91 switches the power source to a state of being driven by the power charged in the supercapacitor 76 from the terminal 72b.

Note that, in a case where it is determined in step S18 that the engine is not stopped, the processing of step S19 is skipped.

In step S19, the power source switching unit 91 determines whether or not an instruction on termination has been given, and in a case where the instruction on termination has not been given, the processing returns to step S16.

That is, the processing of steps S16 to S20 is repeated until instruction on termination is given.

Then, in step S20, when instruction on termination is given, the operation is terminated.

Therefore, the emergency reporting device 52 is driven by the power from the power source 51 when the engine is started, and is driven by the power charged by the supercapacitor 76 when the engine is stopped and the power supply from the power source 51 is stopped.

As a result, even if an emergency situation occurs and the engine stops and the power supply from the power source 51 stops, the emergency reporting device 52 can be driven within the range of the capacitance charged in the supercapacitor 76.

In the above description, an example has been described in which the degree of deterioration of the supercapacitor 76, which is a power source in the emergency reporting device 52 in a state where the engine is stopped, is evaluated on the basis of the charging time. However, hardware other than the emergency reporting device 52 may be used as long as the supercapacitor is used as a power source under a condition where power source supply from the outside cannot be received.

3. Application Example

Configuration Example of Call Center Server Having Management Server Function

Although the example in which the emergency report management processing is realized by the emergency reporting device 52, the user terminal 32, the management server 33, and the call center server 34 mounted on the vehicle 31 has been described above, the emergency report management processing may be realized by the emergency reporting device 52, the user terminal 32, and the call center server 34 excluding the management server 33 by providing the function of the management server 33 to the call center server 34.

Figure 13:
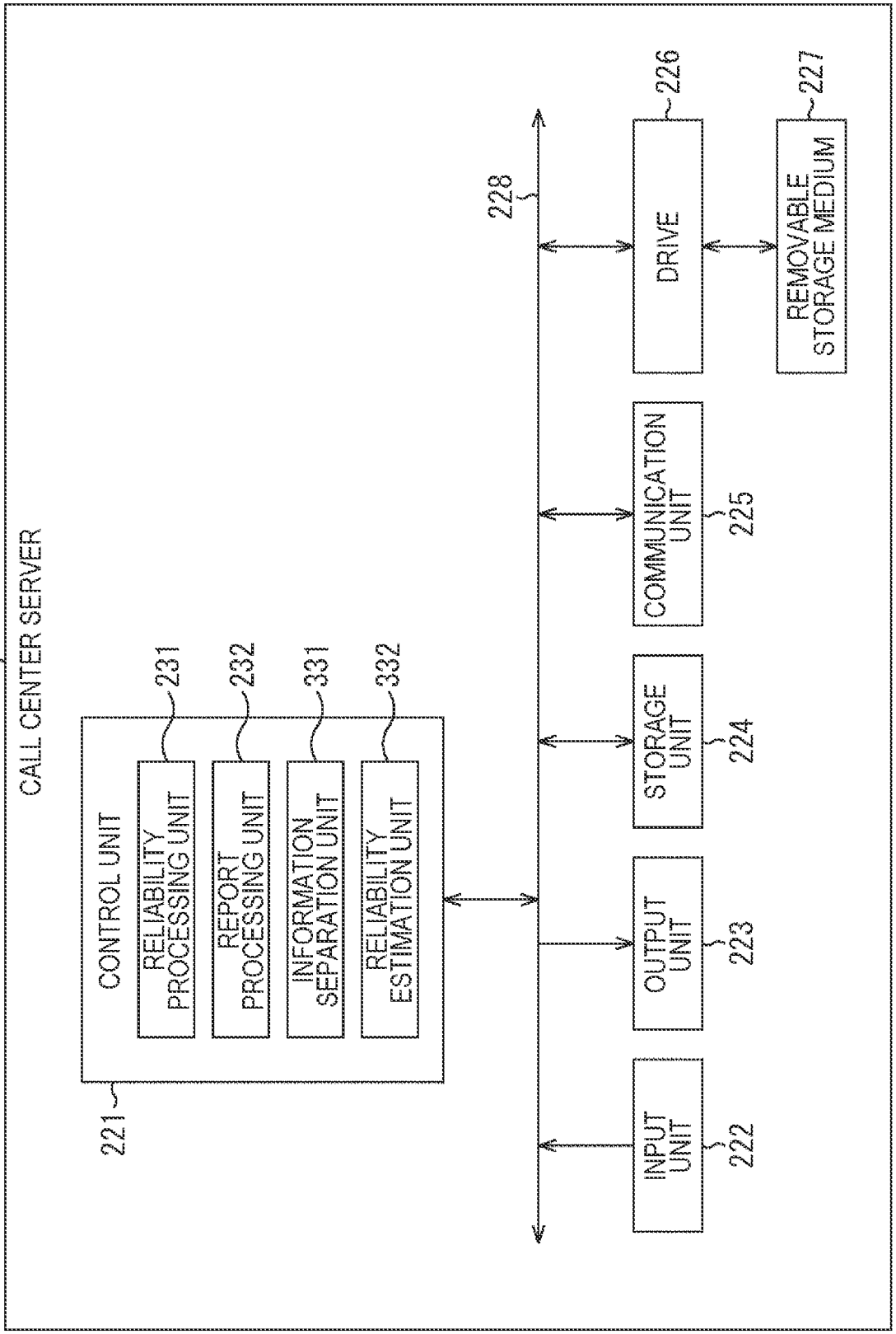
FIG. 13 is a diagram illustrating an application example of a configuration of the call center server.

FIG. 13 is a configuration example of the call center server 34 having the function of the management server 33. Note that, in the call center server 34 in FIG. 13, components having the same functions as those in the call center server 34 in FIG. 7 are denoted by the same reference numerals, and description will be omitted as appropriate.

Figure 7:
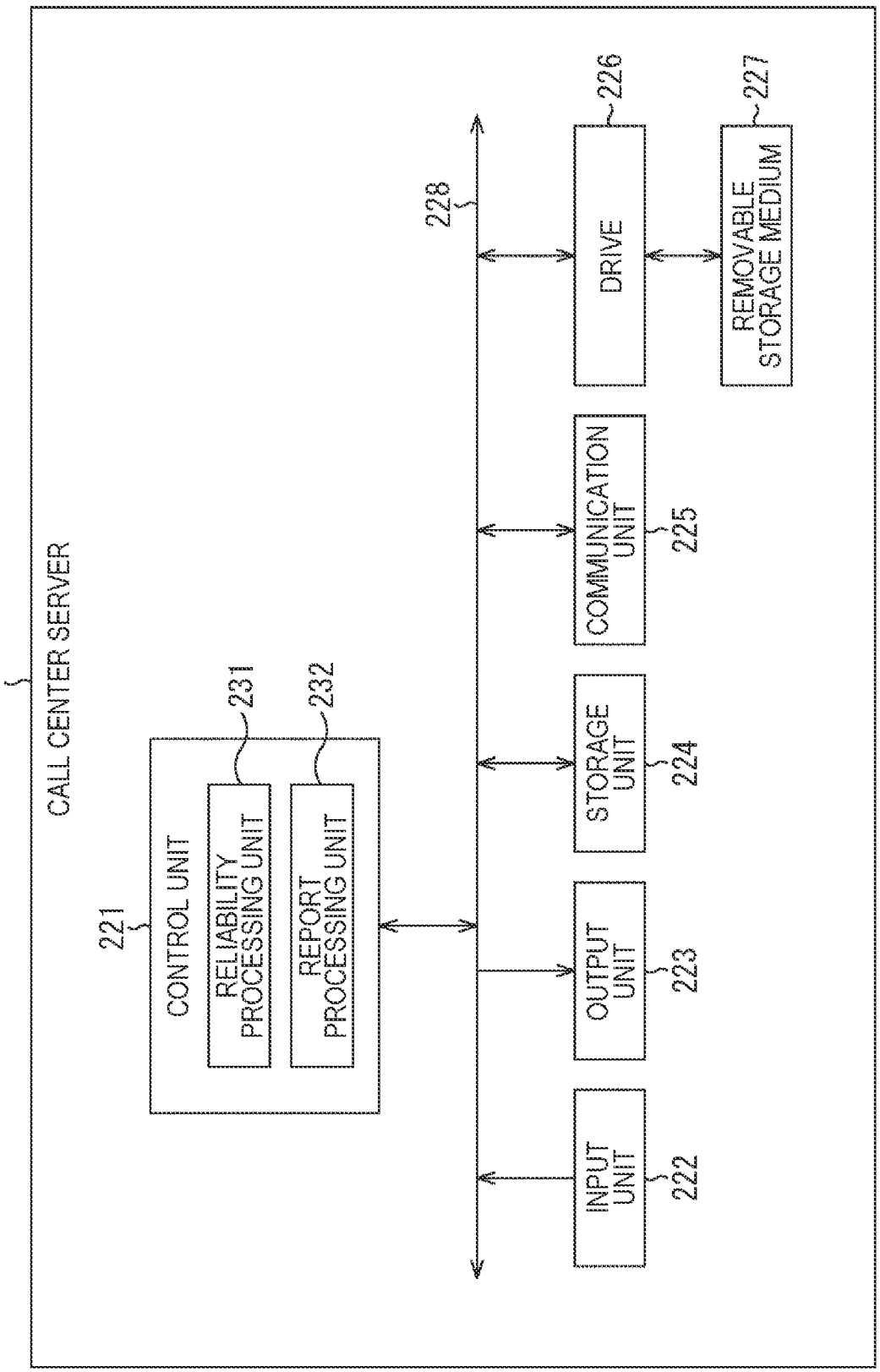
FIG. 7 is a diagram illustrating a configuration example of a call center server.

That is, the call center server 34 in FIG. 13 is different from the call center server 34 in FIG. 7 in that an information separation unit 331 and a reliability estimation unit 332 are newly provided.

Furthermore, since the information separation unit 331 and the reliability estimation unit 332 have the same functions as an information separation unit 101 and a reliability estimation unit 102 in the management server 33 in FIG. 6, the description will be omitted.

That is, the call center server 34 in FIG. 13 has a configuration having both the function of the management server 33 in FIG. 6 and the function of the call center server 34 in FIG. 7.

<Emergency Report Management Processing by Call Center Server in FIG. 13>

Figure 14:
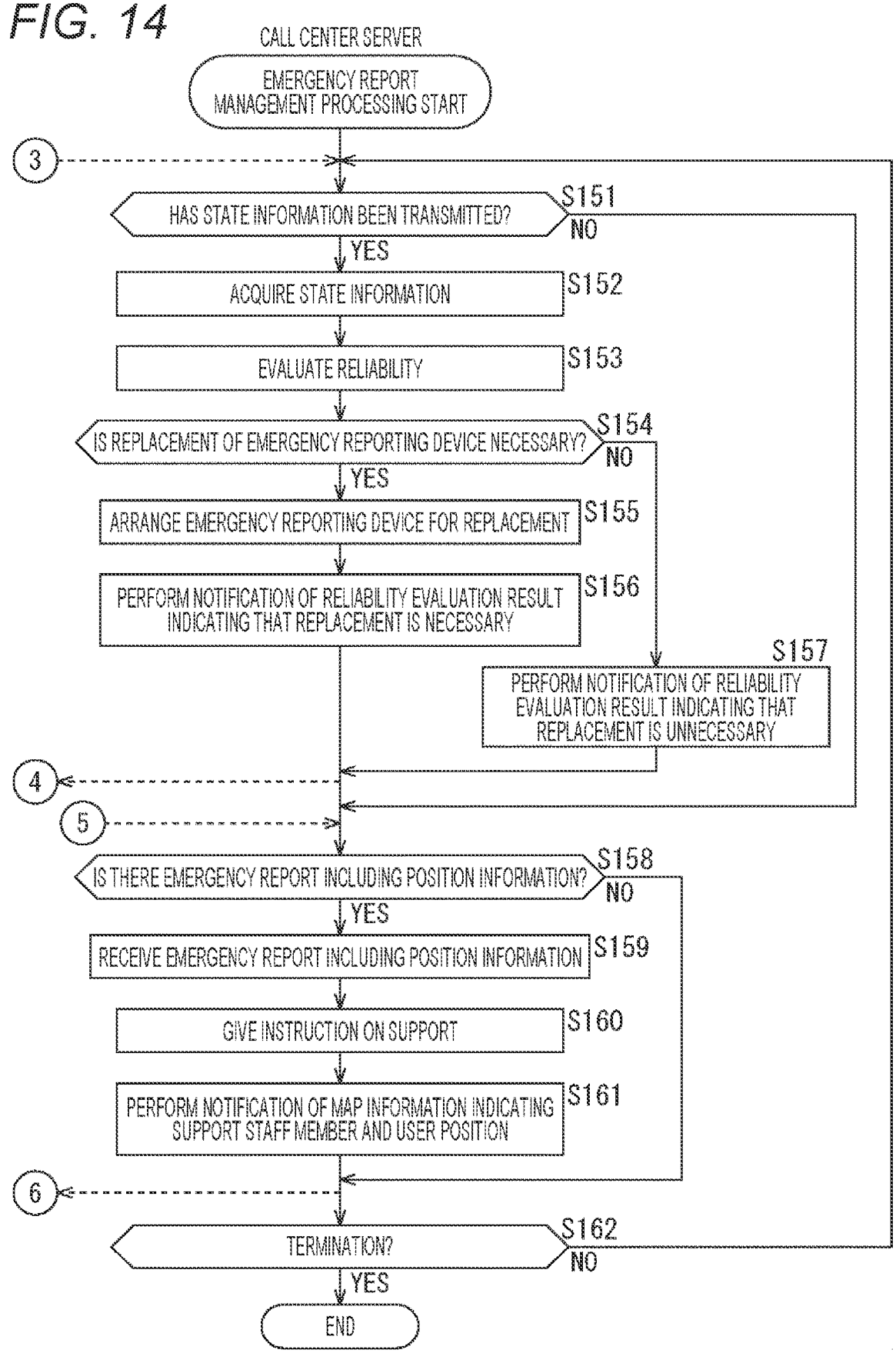
FIG. 14 is a flowchart illustrating an emergency report management processing by the call center server in FIG. 13.

Next, an emergency report management processing by the call center server 34 in FIG. 13 will be described with reference to a flowchart in FIG. 14.

Note that processing of the emergency reporting device 52 and the user terminal 32 in this example is similar to the processing described with reference to FIGS. 9 and 10, respectively, and thus description is omitted.

However, in this case, the information transmitted by the user terminal 32 to the management server 33 is transmitted to the call center server 34, and the information received by the user terminal 32 from the management server 33 is received from the call center server 34.

In step S151, the information separation unit 331 controls the communication unit 225 to determine whether or not the information on the charging time of the supercapacitor 76 as the state information has been transmitted from the user terminal 32 via the network 35.

In a case where it is determined in step S151 that the information on the charging time of the supercapacitor 76 as the state information has been transmitted from the user terminal 32, the processing proceeds to step S152.

In step S152, the information separation unit 331 controls the communication unit 225 to receive the state information including the information on the charging time of the supercapacitor 76 transmitted from the management server 33, and outputs the state information to the reliability estimation unit 332.

In step S153, the reliability estimation unit 332 obtains the evaluation value E representing the reliability of the emergency reporting device 52 by calculating formula (1) described above, compares the evaluation value E with the evaluation threshold value Eth defined by formula (2) to evaluate the evaluation value E, and outputs the evaluation value E to the reliability processing unit 231.

In step S154, the reliability processing unit 231 determines whether or not the reliability evaluation result is information that the reliability of the emergency reporting device 52 is low and replacement is necessary.

In step S155, in a case where the reliability evaluation result is information indicating that the reliability of the emergency reporting device 52 is low and replacement is necessary, the processing proceeds to step S155.

In step S155, the reliability processing unit 231 gives instruction on arrangement of the emergency reporting device 52 for replacement to replace the emergency reporting device 52, and causes the emergency reporting device 52 for replacement to be delivered to the user who is the corresponding insurance contractor by home delivery.

In step S156, the reliability processing unit 231 generates a reliability evaluation result indicating that the reliability of the emergency reporting device 52 is low and replacement is necessary, and a notification indicating that the replacement emergency reporting device 52 has been arranged, and controls the communication unit 225 to transmit the result to the user terminal 32 via the network 35.

On the other hand, in step S154, in a case where the reliability evaluation result is information indicating that the reliability of the emergency reporting device 52 is sufficient and replacement is unnecessary, the processing proceeds to step S157.

In step S157, the reliability processing unit 231 controls the communication unit 225 to transmit the reliability evaluation result indicating that the emergency reporting device 52 does not need to be replaced to the user terminal 32 via the network 35.

In step S158, the report processing unit 232 controls the communication unit 225 to determine whether or not an emergency report has been transmitted from the user terminal 32 via the network 35.

In a case where the emergency report is transmitted in step S158, the processing proceeds to step S159.

In step S159, the report processing unit 232 controls the communication unit 225 to receive the emergency report including the position information transmitted from the user terminal 32 via the network 35.

In step S160, the report processing unit 232 identifies the position of the vehicle 31 that has transmitted the emergency report on the basis of the position information, and generates information instructing the staff member for support.

In step S161, the report processing unit 232 acquires the position information detected by the mobile terminal possessed by the staff member toward the support, generates the map information including the position information of the vehicle 31 that has transmitted the emergency report and the position information of the staff toward the support, and controls the communication unit 225 to transmit the map information to the user terminal 32 via the network 35.

Note that, in step S151, in a case where the state information has not been transmitted, the processing of steps S152 to S157 is skipped. Furthermore, in a case where there is no emergency report in step S158, the processing of steps S159 to S161 is skipped.

Moreover, in step S162, the report processing unit 232 determines whether or not an instruction on termination has been given, and in a case where the instruction on termination has not been given, the processing returns to step S151. That is, the processing of steps S151 to S162 is repeated until instruction on termination is given.

Then, in step S162, when instruction on termination is given, the processing is terminated.

Note that, in the above description, an example has been described in which the emergency report management processing is realized by the emergency reporting device 52, the user terminal 32, and the call center server 34 by providing the function of the management server 33 in FIG. 6 to the call center server 34 in FIG. 7. However, the emergency report management processing may be realized by the emergency reporting device 52, the user terminal 32, and the management server 33 by providing the function of the call center server 34 in FIG. 7 to the management server 33 in FIG. 6.

Also in the above processing, when the engine is started, the charging time of the supercapacitor 76 of the emergency reporting device 52 is measured and transmitted to the call center server 34 via the user terminal 32.

In the call center server 34, reliability of the emergency reporting device 52 is evaluated on the basis of the charging time, and information indicating necessity of replacement of the emergency reporting device 52 is generated as a reliability evaluation result and transmitted to the user terminal 32.

In the user terminal 32, information indicating necessity of replacement of the emergency reporting device 52 as a reliability evaluation result based on the charging time of the supercapacitor 76 of the emergency reporting device 52 is displayed.

With the above processing, it is possible to appropriately identify the emergency reporting device 52 that needs to be replaced according to the degree of deterioration from the reliability evaluation result based on the charging time of the supercapacitor 76 of the emergency reporting device 52.

As a result, it is possible to reduce the cost and replace the deteriorated emergency reporting device at an appropriate timing while maintaining the reliability.

4. Example Executed by Software

Meanwhile, the above-described series of processing can be executed by hardware, but can also be executed by software. In a case where the series of processing is executed by software, a program constituting the software is installed from a recording medium to a computer incorporated in dedicated hardware or, for example, a general-purpose computer and the like capable of executing various functions by installing various programs.

Figure 15:
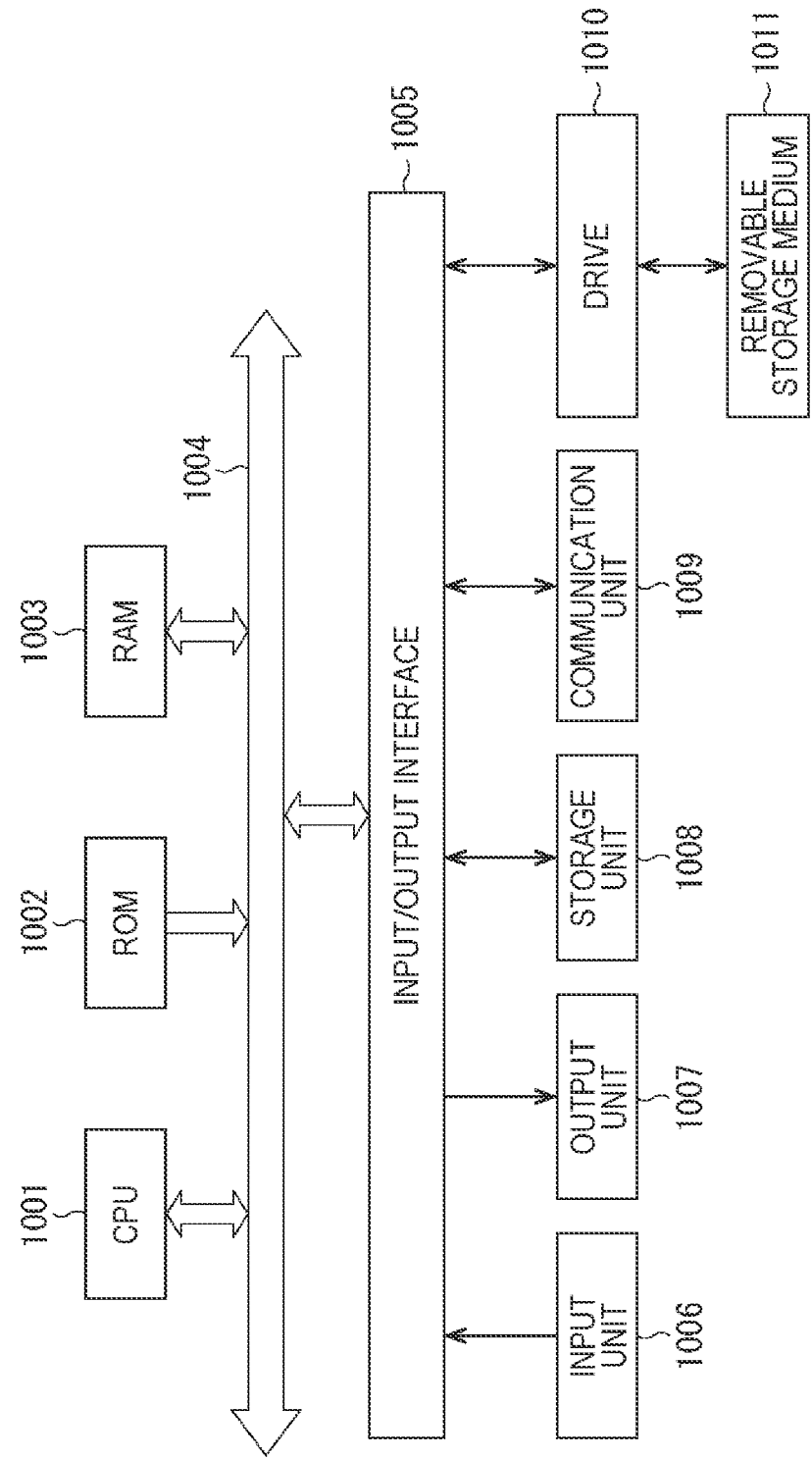
FIG. 15 is a diagram illustrating a configuration example of a general-purpose personal computer.

FIG. 15 illustrates a configuration example of a general-purpose computer. The personal computer includes a central processing unit (CPU) 1001. An input/output interface 1005 is connected to the CPU 1001 via a bus 1004. A read only memory (ROM) 1002 and a random access memory (RAM) 1003 are connected to the bus 1004.

The input/output interface 1005 is connected with an input unit 1006 including an input device such as a keyboard and a mouse with which a user inputs an operation command, an output unit 1007 that outputs a processing operation screen and an image of a processing result to a display device, a storage unit 1008 including a hard disk drive and the like that stores a program and various data, and a communication unit 1009 including a local area network (LAN) adapter and the like and executing communication processing via a network represented by the Internet. Furthermore, a drive 1010 that reads and writes data from and to a removable storage medium 1011 such as a magnetic disk (including a flexible disk), an optical disk (including a compact disc-read only memory (CD-ROM) and a digital versatile disc (DVD)), a magneto-optical disk (including a mini disc (MD)), or a semiconductor memory and the like is connected.

The CPU 1001 executes various processings according to a program stored in the ROM 1002 or a program read from the removable storage medium 1011 such as a magnetic disk, an optical disk, a magneto-optical disk, or a semiconductor memory and the like, installed in the storage unit 1008, and loaded from the storage unit 1008 to the RAM 1003. The RAM 1003 also appropriately stores data and the like necessary for the CPU 1001 to execute various processings.

In the computer configured as described above, for example, the CPU 1001 loads a program stored in the storage unit 1008 into the RAM 1003 via the input/output interface 1005 and the bus 1004 and executes the program, and thus, the above-described series of processing is performed.

The program executed by the computer (CPU 1001) can be provided by being recorded in the removable storage medium 1011 as a package medium and the like, for example. Furthermore, the program can be provided via a wired or wireless transmission medium such as a local area network, the Internet, or digital satellite broadcasting.

In the computer, the program can be installed in the storage unit 1008 via the input/output interface 1005 by attaching the removable storage medium 1011 to the drive 1010. Furthermore, the program can be received by the communication unit 1009 via a wired or wireless transmission medium and installed in the storage unit 1008. In addition, the program can be installed in the ROM 1002 or the storage unit 1008 in advance.

Note that the program executed by the computer may be a program in which processing is performed in time series in the order described in the present specification, or may be a program in which processing is performed in parallel or at necessary timing such as when a call is made and the like.

Figure 3:
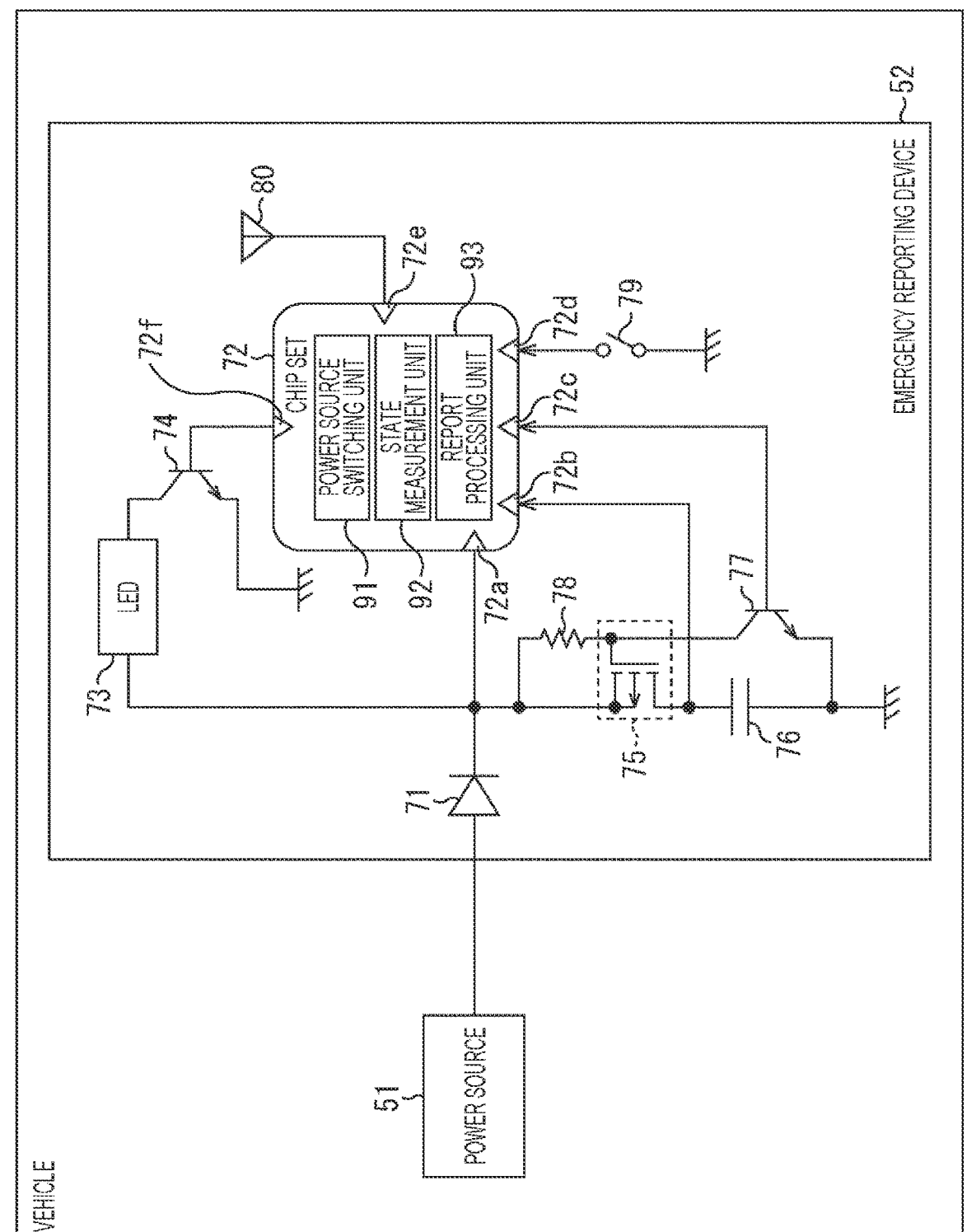
FIG. 3 is a diagram illustrating a configuration example of an emergency reporting device.
Figure 4:
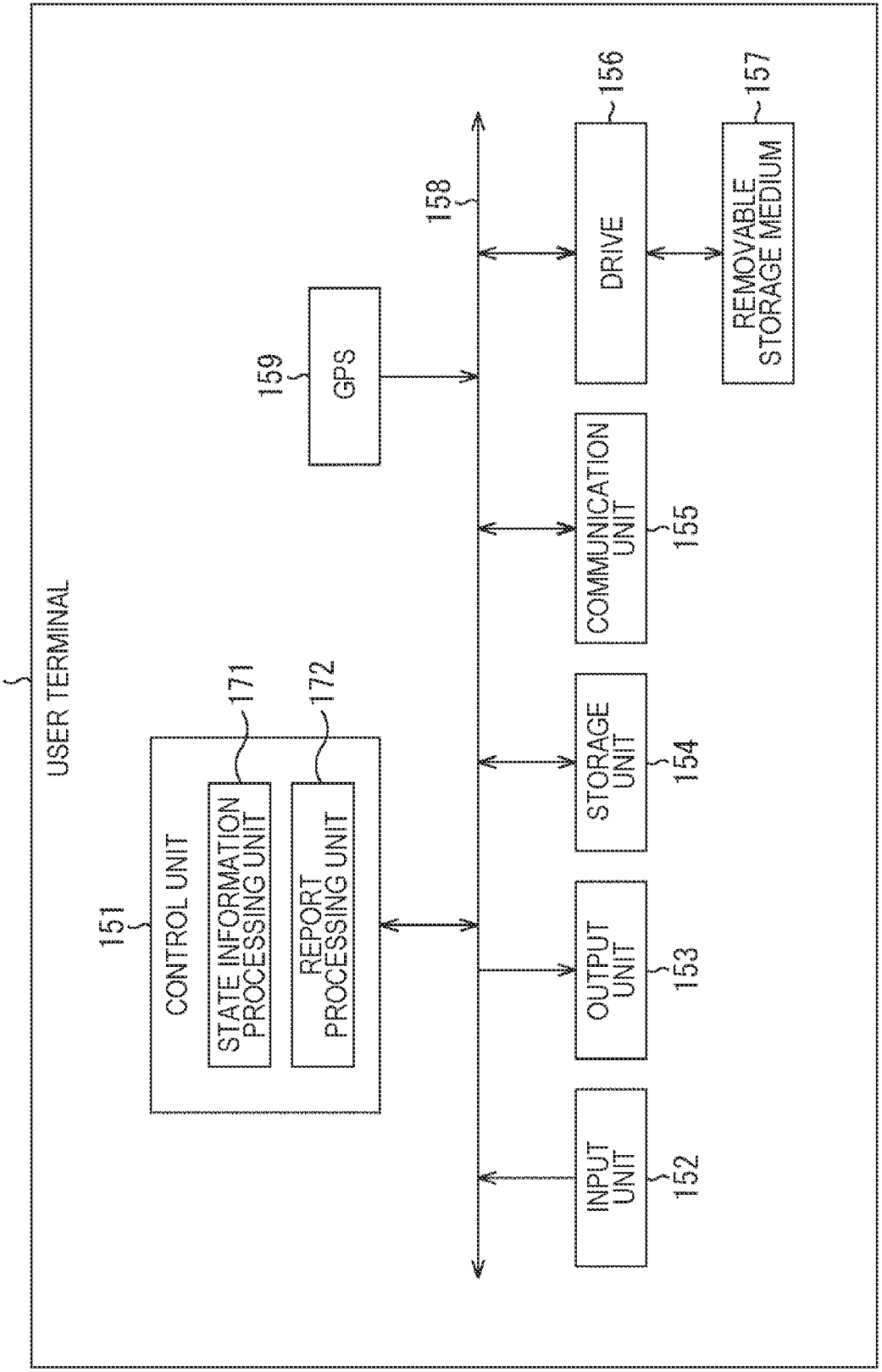
FIG. 4 is a diagram illustrating a configuration example of a user terminal.
Figure 5:
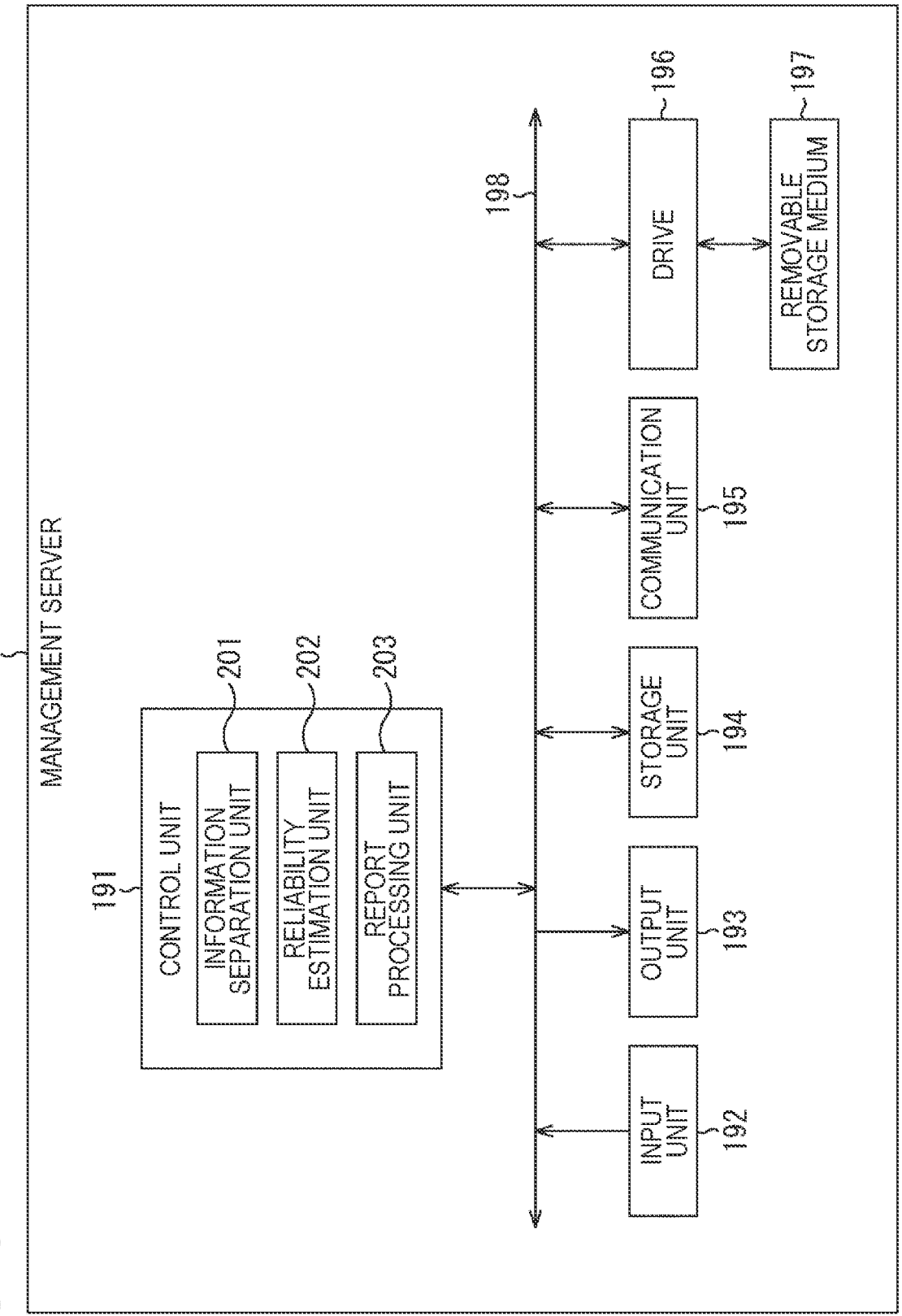
FIG. 5 is a diagram illustrating a configuration example of a management server.

Note that, the CPU 1001 in FIG. 15 realizes the functions of the chip set 72 in FIG. 3 and the control units 151, 191, and 221 in FIGS. 4, 5, and 7.

Furthermore, in the present specification, a system means a set of a plurality of components (devices, modules (parts), and the like), and it does not matter whether or not all the components are in the same housing. Therefore, a plurality of devices housed in separate housings and connected via a network and one device in which a plurality of modules is housed in one housing are both systems.

Note that the embodiments of the present disclosure are not limited to the above-described embodiments, and various modifications can be made without departing from the gist of the present disclosure.

For example, the present disclosure can have a configuration of cloud computing in which one function is shared and processed in cooperation by a plurality of devices via a network.

Furthermore, each step described in the above-described flowchart can be executed by one device or can be shared and executed by a plurality of devices.

Moreover, in a case where a plurality of processes is included in one step, the plurality of processings included in the one step can be executed by one device or can be shared and executed by a plurality of devices.

Note that the present disclosure can also have the following configurations.

<1> An information processing device including:
a state information acquisition unit that acquires state information indicating a degree of deterioration of hardware; and
a reliability evaluation unit that evaluates reliability of the hardware on a basis of the state information.

<2> The information processing device according to <1>, in which
the state information acquisition unit acquires state information indicating a degree of deterioration of a power source of the hardware.

<3> The information processing device according to <2>, in which
the power source of the hardware is a supercapacitor.

<4> The information processing device according to <3>, in which
the state information acquisition unit acquires a charging time from start of charging of the supercapacitor to full charge as state information indicating a degree of deterioration of the power source of the hardware.

<5> The information processing device according to <4>, in which
the reliability evaluation unit evaluates a degree of deterioration of the power source of the hardware on a basis of the charging time, determines necessity of replacement of the hardware, and outputs a reliability evaluation result including a determination result.

<6> The information processing device according to <5>, in which
the reliability evaluation unit calculates an evaluation value on a basis of the charging time, determines necessity of replacement of the hardware on a basis of the evaluation value, and outputs a reliability evaluation result including the determination result.

<7> The information processing device according to <6>, in which
the reliability evaluation unit determines necessity of replacement of the hardware on a basis of whether or not the evaluation value is lower than the threshold value, and outputs a reliability evaluation result including the determination result.

<8> The information processing device according to <6>, in which
the reliability evaluation unit calculates, as the evaluation value, a time obtained by subtracting a charging time for charging with capacitance when the supercapacitor is deteriorated to a state requiring replacement from the measured charging time, determines necessity of replacement of the hardware from comparison between the evaluation value and a threshold value, and outputs a reliability evaluation result including the determination result.

<9> The information processing device according to <6>, in which
the threshold value is the evaluation value in the capacitance when a state is deteriorated to a state where replacement of hardware including the supercapacitor should be considered.

<10> The information processing device according to <9>, in which
the reliability evaluation unit determines necessity of replacement of the hardware on a basis of a period during which a state in which the evaluation value is lower than the threshold value continues, and outputs a reliability evaluation result including the determination result.

<11> The information processing device according to <10>, in which
the reliability evaluation unit determines necessity of replacement of the hardware on a basis of whether or not a period during which a state in which the evaluation value based on the charging time is lower than the threshold value continues is longer than a predetermined period, and outputs a reliability evaluation result including the determination result.

<12> The information processing device according to <11>, in which
the predetermined period is a period in which the hardware including the supercapacitor is allowed to be used without replacement while the capacitance is deteriorated to a state in which replacement of the hardware including the supercapacitor should be considered.

<13> The information processing device according to <5>, in which
in a case where the reliability evaluation result is information indicating that the hardware needs to be replaced, the state information acquisition unit performs a notification of the information indicating that the hardware needs to be replaced.

<14> The information processing device according to <13>, in which
the hardware is an emergency reporting device mounted on a vehicle.
<15> The information processing device according to <14>, in which
the emergency reporting device measures the charging time from start of charging of the supercapacitor to full charge, and
the state information acquisition unit acquires information on the charging time measured by the emergency reporting device as state information indicating a degree of deterioration of the emergency reporting device.
<16> The information processing device according to <15>, in which
the state information acquisition unit acquires information on the charging time measured by the emergency reporting device as state information indicating a degree of deterioration of the emergency reporting device via a mobile terminal possessed by a user of the vehicle.
<17> The information processing device according to <16>, in which
the state information acquisition unit notifies the mobile terminal of information indicating that the emergency reporting device needs to be replaced, and the mobile terminal acquires and presents the notification.
<18> The information processing device according to any one of <14> to <17>, in which
the emergency reporting device
is driven by power supplied from the vehicle and charges the supercapacitor with the power supplied from the vehicle when an engine of the vehicle is operated, and
is driven by the power charged in the supercapacitor when the engine of the vehicle is stopped.
<19> The information processing device according to any one of <14> to <18>, in which
the emergency reporting device includes an emergency report button operated by a user in a case where an emergency situation occurs.
<20> An information processing method including:
acquiring state information indicating a degree of deterioration of hardware; and
evaluating reliability of the hardware on a basis of the state information.

REFERENCE SIGNS LIST

11 Emergency reporting system
31, 31-1 to 31-n Vehicle
32, 32-1 to 32-n User terminal
33 Management server
34 Call center server
51, 51-1 to 51-n Power source
52, 52-1 to 52-n Emergency reporting device
72 Chip set
76 Supercapacitor
79 Emergency report button
92 State measurement unit
93 Report processing unit
151 Control unit
159 GPS
171 State information processing unit
172 Report processing unit
191 Control unit
201 Information separation unit
202 Reliability estimation unit
203 Report processing unit
221 Control unit
231 Reliability processing unit
232 Report processing unit
311 Reliability processing unit
312 Report processing unit

The invention claimed is:

1. An information processing device comprising:
circuitry configured to
acquire state information indicating a degree of deterioration of a power source of hardware, and
evaluate reliability of the hardware based on the acquired state information,
wherein the power source of the hardware includes a supercapacitor,
wherein the degree of deterioration is indicated as a charging time from start of charging of the supercapacitor to full charge, and
wherein the circuitry is further configured to
calculate an evaluation value based on the charging time, the evaluation value being calculated as a time obtained by subtracting a charging time for charging with capacitance when the supercapacitor is deteriorated to a state requiring replacement from the measured charging time, and
determine necessity of replacement of the hardware from a comparison between the evaluation value and a threshold value.

2. The information processing device according to claim 1,
wherein the circuitry is further configured to output a reliability evaluation result including a determination result regarding the necessity of replacement of the hardware.

3. The information processing device according to claim 2,
wherein the threshold value is the evaluation value in the capacitance when a state is deteriorated to a state where replacement of hardware including the supercapacitor should be considered.

4. The information processing device according to claim 3,
wherein the circuitry determines the necessity of replacement of the hardware based on a period during which a state in which the evaluation value is lower than the threshold value continues.

5. The information processing device according to claim 4,
wherein the circuitry determines the necessity of replacement of the hardware based on whether or not a period during which a state in which the evaluation value based on the charging time is lower than the threshold value continues is longer than a predetermined period.

6. The information processing device according to claim 5,
wherein the predetermined period is a period in which the hardware including the supercapacitor is allowed to be used without replacement while the capacitance is deteriorated to a state in which replacement of the hardware including the supercapacitor should be considered.

7. The information processing device according to claim 2,
wherein in a case where the reliability evaluation result is information indicating that the hardware needs to be replaced, the circuitry is further configured to perform a notification of the information indicating that the hardware needs to be replaced.

8. The information processing device according to claim 7,
wherein the hardware is an emergency reporting device mounted on a vehicle.

9. The information processing device according to claim 8,
wherein the emergency reporting device measures the charging time from start of charging of the supercapacitor to full charge, and
wherein the circuitry acquires information on the charging time measured by the emergency reporting device as state information indicating a degree of deterioration of the emergency reporting device.

10. The information processing device according to claim 9,
wherein the circuitry acquires the information on the charging time measured by the emergency reporting device via a mobile terminal possessed by a user of the vehicle.

11. The information processing device according to claim 10,
wherein the circuitry is further configured to notify the mobile terminal of information indicating that the emergency reporting device needs to be replaced, and
wherein the mobile terminal is configured to acquire and present the notification.

12. The information processing device according to claim 8, wherein the emergency reporting device
is driven by power supplied from the vehicle and charges the supercapacitor with the power supplied from the vehicle when an engine of the vehicle is operated, and is driven by the power charged in the supercapacitor when the engine of the vehicle is stopped.

13. The information processing device according to claim 8,
wherein the emergency reporting device includes an emergency report button operated by a user in a case where an emergency situation occurs.

14. The information processing device according to claim 1,
wherein the circuitry determines the necessity of replacement of the hardware based on whether or not the evaluation value is lower than the threshold value.

15. An information processing method comprising:
acquiring state information indicating a degree of deterioration of a power source of hardware; and
evaluating reliability of the hardware based on the state information,
wherein the power source of the hardware includes a supercapacitor,
wherein the degree of deterioration is indicated as a charging time from start of charging of the supercapacitor to full charge, and
wherein the method further comprises:
calculating an evaluation value based on the charging time, the evaluation value being calculated as a time obtained by subtracting a charging time for charging with capacitance when the supercapacitor is deteriorated to a state requiring replacement from the measured charging time; and
determining necessity of replacement of the hardware from a comparison between the evaluation value and a threshold value.

* * * * *